United States Patent
Yang et al.

(10) Patent No.: US 11,597,876 B2
(45) Date of Patent: Mar. 7, 2023

(54) QUANTUM DOTS, COMPOSITES, AND DEVICE INCLUDING THE SAME

(71) Applicant: Samsung Display Co., Ltd., Yongin-si (KR)

(72) Inventors: Hyeyeon Yang, Suwon-si (KR); Jooyeon Ahn, Suwon-si (KR); Tae Gon Kim, Hwaseong-si (KR); Jongmin Lee, Hwaseong-si (KR); Shin Ae Jun, Seongnam-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 39 days.

(21) Appl. No.: 17/227,668

(22) Filed: Apr. 12, 2021

(65) Prior Publication Data

US 2021/0317365 A1   Oct. 14, 2021

(30) Foreign Application Priority Data

Apr. 14, 2020 (KR) .................. 10-2020-0045546

(51) Int. Cl.
*C09K 11/62* (2006.01)
*C09K 11/56* (2006.01)
(Continued)

(52) U.S. Cl.
CPC .......... *C09K 11/621* (2013.01); *C09K 11/025* (2013.01); *C09K 11/565* (2013.01);
(Continued)

(58) Field of Classification Search
CPC ... C09K 11/621; C09K 11/565; C09K 11/883; C09K 11/70; C09K 11/025; G02F 1/133614
See application file for complete search history.

(56) References Cited

U.S. PATENT DOCUMENTS 7,867,557 B2   1/2011 Pickett et al.
10,197,820 B2   2/2019 Youn et al.
(Continued)

FOREIGN PATENT DOCUMENTS

CN   107636111 A   1/2018
CN   108239535 A   7/2018
(Continued)

*Primary Examiner* — C Melissa Koslow
(74) *Attorney, Agent, or Firm* — Cantor Colburn LLP

(57) ABSTRACT

A quantum dot, and a quantum dot composite and a device including the same, wherein the quantum dot includes a seed including a first semiconductor nanocrystal, a quantum well layer disposed on the seed and a shell disposed on the quantum well layer, the shell including a second semiconductor nanocrystal, and wherein the quantum dot does not include cadmium, wherein the first semiconductor nanocrystal includes a first zinc chalcogenide, wherein the second semiconductor nanocrystal includes a second zinc chalcogenide, and the quantum well layer includes an alloy semiconductor nanocrystal including indium (In), phosphorus (P), and gallium (Ga), and wherein a bandgap energy of the alloy semiconductor nanocrystal is less than a bandgap energy of the first semiconductor nanocrystal and less than a bandgap energy of the second semiconductor nanocrystal.

20 Claims, 10 Drawing Sheets

(51) Int. Cl.
    *C09K 11/70*         (2006.01)
    *H05B 33/14*        (2006.01)
    *G03F 7/20*          (2006.01)
    *G03F 7/004*        (2006.01)
    *C09K 11/88*         (2006.01)
    *C09K 11/02*         (2006.01)
    *G02F 1/1335*       (2006.01)
    *B82Y 40/00*        (2011.01)
    *B82Y 20/00*        (2011.01)
    *B82Y 30/00*        (2011.01)

(52) U.S. Cl.
    CPC ............ *C09K 11/70* (2013.01); *C09K 11/883* (2013.01); *G02F 1/133614* (2021.01); *G03F 7/0043* (2013.01); *G03F 7/2004* (2013.01); *H05B 33/14* (2013.01); *B82Y 20/00* (2013.01); *B82Y 30/00* (2013.01); *B82Y 40/00* (2013.01)

(56) References Cited

U.S. PATENT DOCUMENTS

| | | |
|---|---|---|
| 10,741,731 B2 | 8/2020 | Jang et al. |
| 10,851,297 B2 * | 12/2020 | Kim .................. C09K 11/0883 |
| 2017/0052444 A1 | 2/2017 | Park et al. |

FOREIGN PATENT DOCUMENTS

| | | |
|---|---|---|
| CN | 109935722 A | 6/2019 |
| CN | 109971481 A | 7/2019 |
| CN | 110137363 A | 8/2019 |
| JP | 2010106119 A | 5/2010 |
| KR | 20140121217 A | 10/2014 |
| KR | 1739751 B1 | 5/2017 |
| KR | 20190032017 A | 3/2019 |

\* cited by examiner

Pattern Preparation by using a photoresist

Repeating the Patterning Process three times

QUANTUM DOTS, COMPOSITES, AND DEVICE INCLUDING THE SAME

CROSS-REFERENCE TO RELATED APPLICATIONS

This application claims priority to and the benefit of Korean Patent Application No. 10-2020-0045546 filed in the Korean Intellectual Property Office on Apr. 14, 2020, and all the benefits accruing therefrom under 35 U.S.C. § 119, the content of which in its entirety is herein incorporated by reference.

BACKGROUND

1. Field

Quantum dots, a composition or a composite including the same, and a device including the same are disclosed.

2. Description of the Related Art

Unlike a bulk material, physical characteristics (e.g., bandgap energies and melting points) of a semiconductor nanoparticle may be controlled by changing the size of the nanoparticle. For example, a semiconductor nanocrystal particle (also known as a quantum dot) is a crystalline material having a size in a range of several nanometers. Because the semiconductor nanocrystal particle has a relatively small size, the nanocrystal particle has a large surface area per unit volume, and thereby, the particle exhibits a quantum confinement effect and will have different properties than bulk materials of the same chemical composition. A quantum dot may absorb energy from an excitation source, e.g., light or an applied electric current, and upon relaxation to the ground state the quantum dot emits light energy corresponding to a bandgap energy of the quantum dot.

SUMMARY

An embodiment provides a quantum dot(s) and a composition including the same capable of exhibiting improved photoluminescence properties.

An embodiment provides a quantum dot composite including the quantum dot(s).

An embodiment provides a method of producing the quantum dot(s).

An embodiment provides an electronic device including the quantum dot.

In an embodiment, a quantum dot (or quantum dots) includes a seed including a first semiconductor nanocrystal, a quantum well layer disposed on the seed and a shell disposed on the quantum well layer, the shell including a second semiconductor nanocrystal, and wherein the quantum dot does not include cadmium, wherein the first semiconductor nanocrystal includes a first zinc chalcogenide, wherein the second semiconductor nanocrystal includes a second zinc chalcogenide, wherein the quantum well layer includes an alloy semiconductor nanocrystal including indium (In), phosphorus (P), and gallium (Ga), wherein a bandgap energy of the alloy semiconductor nanocrystal is less than a bandgap energy of the first semiconductor nanocrystal and less than a bandgap energy of the second semiconductor nanocrystal.

The first zinc chalcogenide may include ZnSe, ZnTeSe, ZnSeS, ZnS, or a combination thereof.

The second zinc chalcogenide may include ZnSe, ZnTeSe, ZnSeS, ZnS, or a combination thereof.

The first semiconductor nanocrystal and the second semiconductor nanocrystal may have different compositions from one another.

The first semiconductor nanocrystal and the second semiconductor nanocrystal may have the same composition with each other.

The first semiconductor nanocrystal may include ZnSe, ZnTeSe, ZnSeS, ZnS, or a combination thereof.

The second semiconductor nanocrystal may include ZnSe, ZnSeS, ZnS, or a combination thereof.

The quantum dot may have a total molar amount of indium and phosphorus of less than or equal to about 20%, based on a total number of moles of elements in the quantum dot (e.g., as measured by an inductively coupled plasma (ICP) analysis).

In the quantum dot, a mole ratio of phosphorus with respect to indium (P:In) may be greater than or equal to about 0.7:1 and less than or equal to about 1.3:1.

In the quantum dot, a mole ratio of gallium with respect to a sum of indium and gallium (Ga:(In+Ga)) may be greater than or equal to about 0.01:1.

In the quantum dot, a mole ratio of gallium with respect to a sum of indium and gallium (Ga:(In+Ga)) may be less than or equal to about 0.5:1.

In the quantum dot, a mole ratio of gallium with respect to a sum of indium and gallium (Ga:(In+Ga)) may be greater than or equal to about 0.05:1.

In the quantum dot, a mole ratio of gallium with respect to a sum of indium and gallium (Ga:(In+Ga)) may be less than or equal to about 0.3:1.

In the quantum dot, a mole ratio of zinc with respect to a sum of indium and gallium (Zn:(In+Ga)) may be greater than or equal to about 10:1.

In the quantum dot, a mole ratio of zinc with respect to a sum of indium and gallium (Zn:(In+Ga)) may be less than or equal to about 45:1, or less than or equal to about 30:1.

The first semiconductor nanocrystal and/or the second semiconductor nanocrystal may include selenium. In the quantum dot, a mole ratio of selenium respect to a sum of indium and gallium (Se:(In+Ga)) may be less than or equal to about 15:1.

In the quantum dot, a mole ratio of phosphorus with respect to a sum of indium and gallium (P:(In+Ga)) may be greater than or equal to about 0.5:1.

In the quantum dot, a mole ratio of phosphorus with respect to a sum of indium and gallium (P:(In+Ga)) may be less than or equal to about 1.3:1.

In the quantum dot, a mole ratio of phosphorus with respect to a sum of indium and gallium (P:(In+Ga)) may be less than or equal to about 0.77:1.

In the quantum dot, a mole ratio of a sum of indium and gallium with respect to a sum of chalcogen elements may be greater than or equal to about 0.03:1.

In the quantum dot, a mole ratio of a sum of indium and gallium with respect to a sum of chalcogen elements may be less than or equal to about 0.2:1.

The shell may include a first layer including a third zinc chalcogenide and a second layer being disposed on the second layer and including a fourth zinc chalcogenide that includes a different composition from the third zinc chalcogenide.

The first layer and the second layer may be (e.g., directly) on (e.g., in contact with) with each other.

The first layer may include ZnSe, ZnSeS, or a combination thereof.

The second layer may include ZnS.

The first layer may be (e.g., directly) adjacent to (or on or closer to) the quantum well layer and the second layer may be (e.g., included in) an outermost layer of the shell (e.g., an outermost layer of the quantum dot).

A thickness of the quantum well layer may be greater than or equal to about 0.1 nanometers (nm) (for example, greater than or equal to about 0.15 nm, greater than or equal to about 0.2 nm, or greater than or equal to about 0.22 nm) and less than or equal to about 1 nm (for example, less than or equal to about 0.8 nm, less than or equal to about 0.6 nm, or less than or equal to about 0.5 nm).

A thickness of the quantum well layer may be less than or equal to about 0.4 nm, or less than or equal to about 0.35 nm.

A size (an average size) of the quantum dot(s) may be greater than or equal to about 3 nm and less than or equal to about 20 nm, less than or equal to about 10 nm, less than or equal to about 5 nm.

The quantum dot may include an organic ligand on a surface thereof.

The organic ligand may include RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are independently a substituted or unsubstituted C1 to C30 aliphatic hydrocarbon, a substituted or unsubstituted C6 to C30 aromatic hydrocarbon, or a combination thereof.

An ultraviolet-visible (UV-Vis) absorption spectrum curve of the quantum dot may not have an inflection point within a wavelength range of about 400 nm to about 650 nm, about 450 nm to about 620 nm, about 540 nm to about 580 nm, or a combination thereof.

An ultraviolet-visible (UV-Vis) absorption spectrum curve of the quantum dot may not have a first absorption peak.

The quantum dot(s) may emit green light.

The quantum dot (or the green light) may have, e.g., exhibit, a maximum luminescent peak wavelength in a range of greater than or equal to about 500 nm and/or less than or equal to about 540 nm.

A quantum efficiency (e.g., quantum yield) of the quantum dot may be greater than or equal to about 30%, or greater than or equal to about 40%.

In an embodiment, a quantum dot composite (e.g., a quantum dot polymer composite) includes a matrix and (e.g., a plurality of) the aforementioned quantum dot(s) dispersed in the (polymer) matrix. The matrix may include a polymer.

The (polymer) matrix may be a linear polymer, a crosslinked polymer, or a combination thereof.

The crosslinked polymer may include a thiolene polymer, a crosslinked poly(meth)acrylate, a crosslinked polyurethane, a crosslinked epoxy resin, a crosslinked vinyl polymer, a crosslinked silicone resin, or a combination thereof.

The linear polymer may include a repeating unit derived from a monomer including a carbon-carbon double bond and optionally a carboxylic acid group.

The matrix may include a compound having a carboxylic acid group.

The linear polymer may include:

a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a copolymer of the monomer combination;

a multiple aromatic ring-containing polymer having a backbone structure in which two aromatic rings are bound to a quaternary carbon atom that is a constituent atom of another cyclic moiety in the main chain and including a carboxylic acid group (—COOH); or a combination thereof.

The polymer matrix may further include a polymerization product of a monomer combination including a thiol compound having a, e.g., at least one, thiol group (for example, at a terminal end thereof) and an ene compound having a carbon-carbon unsaturated bond, a metal oxide particulate (e.g., dispersed in the matrix), or a combination thereof.

The quantum dot (polymer) composite may have a form of a patterned film.

The quantum dot (polymer) composite may have, e.g., exhibit, an light absorption rate (e.g., a ratio of blue light absorption or a blue light absorption rate, hereinafter, referred to as absorption rate) of greater than or equal to about 90% for blue light (e.g., having a wavelength in the range of about 450 nm to about 470 nm) (for example, even after a thermal treatment at about 180° C. for about 30 minutes).

In an embodiment, the quantum dot (polymer) composite may have a blue light conversion efficiency (CE %) or a blue light conversion rate (QE %) of greater than or equal to about 15%, greater than or equal to about 16%, greater than or equal to about 17%, greater than or equal to about 18%, or greater than or equal to about 19%.

In an embodiment, a display device includes a luminescence element (e.g., a photoluminescent element) that includes the aforementioned quantum dot composite. The display device may include a light source, and the light source is configured to provide the luminescence element with incident light.

The incident light may include a light having a peak wavelength of about 440 nm to about 460 nm, or about 450 nm to about 455 nm.

The luminescence element may include a sheet of the quantum dot polymer composite.

The luminescence element may be a stacked structure including a substrate and a light emitting layer disposed on the substrate, wherein the light emitting layer includes a pattern of a quantum dot (polymer) composite.

The pattern may include a, e.g., at least one, repeating section to emit light at a predetermined wavelength.

The repeating section may include a first repeating section that emits first light (e.g., red light).

The repeating section may include a second repeating section that emits second light (e.g., green light) having a different wavelength from the first light.

The repeating section may include a first section emitting red light and a second section emitting green light.

The pattern may include a first repeating section emitting first light and a second repeating section emitting a second light having a luminescent peak wavelength that is different from that of the first light.

In an embodiment, a composition may include (e.g., a plurality of) the aforementioned quantum dot(s); a dispersing agent; a polymerizable monomer including a carbon-carbon unsaturated bond (e.g., a C=C double bond), a (thermal or photo) initiator; and a (organic) solvent (or a liquid vehicle).

The dispersing agent may include a carboxylic acid group containing compound (e.g., the aforementioned binder polymer or a monomer thereof).

The composition may further include a polythiol compound, a metal oxide fine particle, or a combination thereof.

The quantum dot(s) according to an embodiment may exhibit improved properties (e.g., improved luminescence efficiency together with enhanced blue light absorbance). The quantum dot of an embodiment may be used in various display devices and biological labeling (e.g., biosensors or bio-imaging), photodetectors, solar cells, hybrid composites, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
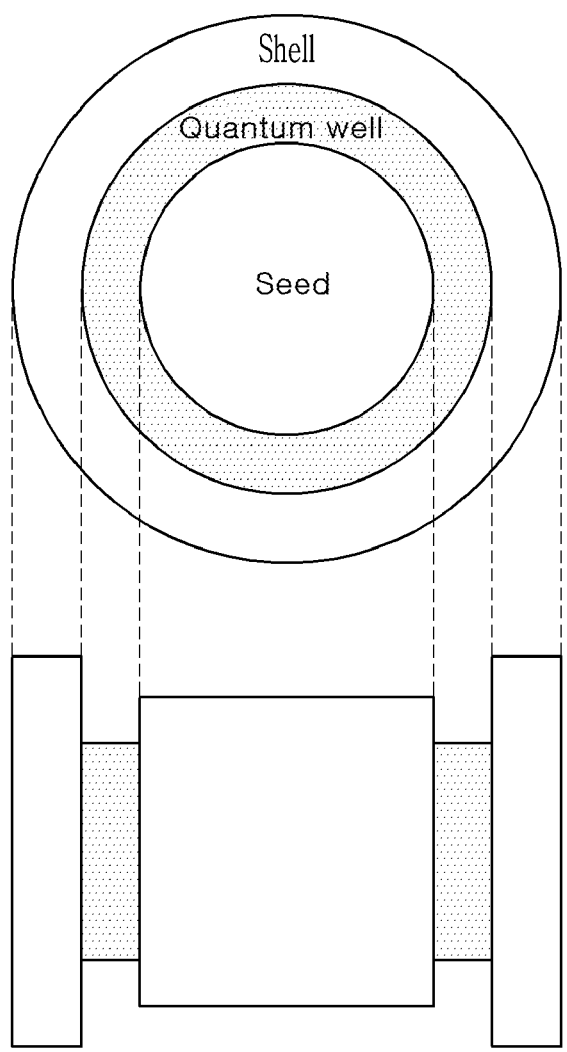
FIG. 1 is a schematic view showing a cross-section of a quantum dot according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or ±5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent such as a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br or —I), a hydroxy group (—OH), a nitro group (—NO$_2$), a cyano group (—CN), an amino or amine group (—NRR' wherein R and R' are each independently hydrogen or a C1 to C6 alkyl group), an azido group (—N$_3$), an amidino group (—O(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, when a definition is not otherwise provided, "hetero" refers to inclusion of one to three heteroatoms such as N, O, S, Si, or P.

As used herein, when a definition is not otherwise provided, "aliphatic hydrocarbon" or "aliphatic hydrocarbon group" may refer to a C1 to C30 linear or branched alkyl group, a C2 to C30 linear or branched alkenyl group, or a C2 to C30 linear or branched alkynyl group.

As used herein, when a definition is not otherwise provided, "aromatic" may refer to a C6 to C30 aryl group or a C2 to C30 heteroaryl group.

As used herein, when a definition is not otherwise provided, "(meth)acrylate" refers to acrylate, methacrylate, or a combination thereof. The (meth)acrylate may include a (C1 to C10 alkyl)acrylate, a (C1 to C10 alkyl)methacrylate, or a combination thereof.

As used herein, "dispersion" refers to dispersion wherein a dispersed phase is a solid and a continuous phase includes a liquid. For example, "dispersion" may refer to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less (e.g., about 2 μm or less or about 1 μm or less).

As used herein, the term light conversion efficiency refers to a percentage of a light emission (A) of a quantum dot composite with respect to excitation light (e.g., blue light) (B). As used herein, a light absorption refers to a percentage of an amount of light absorbed by a quantum dot composite with respect to an amount of incident light (e.g., blue light). The total amount of excitation light (B) is obtained by integration of a luminescence spectrum of the incident light, an amount (B') of incident light passing through the quantum dot-polymer composite film is obtained, and the light conversion rate, the light conversion efficiency, and the light absorption rate are obtained by the following equation:

$(A/B) \times 100\% =$ (blue) light conversion rate (QE %)

$(A/(B-B')) \times 100\% =$ (blue) light conversion efficiency (CE %)

$((B-B')/B) \times 100\% =$ (blue) light absorption rate (%)

The term "average" as used herein (e.g., an average size of the quantum dot) may be mean or median. In an embodiment, the average may be "mean" average.

The quantum efficiency of the quantum dot may be a quantum yield that can be readily and reproducibly measured by any suitable equipment, for example, from Hitachi Co. Ltd or Hamamatsu Co. Ltd and referring to the instruction manuals provided from the manufacturer. In an embodiment, the quantum efficiency (or quantum yield) may be measured in a solution state or a solid state (in a composite). In an embodiment, "quantum yield (or quantum efficiency)" may be a ratio of photons emitted to photons absorbed, e.g., by a nanostructure or population of nanostructures. In an embodiment, the quantum efficiency may be determined by any suitable method. For example, there may be two methods for measuring the fluorescence quantum yield or efficiency: the absolute method and the relative method. The absolute method directly obtains the quantum yield by detecting all sample fluorescence through the use of an integrating sphere. In the relative method, the fluorescence intensity of a standard sample (e.g., a standard dye) may be compared with the fluorescence intensity of an unknown sample to calculate the quantum yield of the unknown sample. Coumarin 153, Coumarin 545, Rhodamine 101 inner salt, Anthracene, and Rhodamine 6G may be used as standard dye, depending on the photoluminescence (PL) wavelengths, but are not limited thereto.

The full width at half maximum (FWHM) and the maximum PL peak wavelength may be determined by a photoluminescent spectrum obtained by a spectrophotometer (or Fluorescence Spectrophotometer).

As used herein, the expression "not including cadmium (or other harmful heavy metal)" may refer to the case in which a concentration of cadmium (or other harmful heavy metal) may be less than or equal to about 100 parts per million by weight (ppmw), less than or equal to about 50 ppmw, less than or equal to about 10 ppmw, less than or equal to about 1 ppmw, less than or equal to about 0.1 ppmw, less than or equal to about 0.01 ppmw, or about zero. In an embodiment, substantially no amount of cadmium (or other harmful heavy metal) may be present or, if present, an amount of cadmium (or other harmful heavy metal) may be less than or equal to a detection limit or as an impurity level of a given analysis tool (e.g., an inductively coupled plasma atomic emission spectroscopy).

As used herein, "first absorption peak" or a wavelength thereof refers to a main peak appearing first in the lowest energy region in an ultraviolet-visible absorption spectrum and a wavelength thereof.

A quantum dot (or a semiconductor nanocrystal particle) is a crystalline semiconductor material having a size of several nanometers. The quantum dot may have a large surface area per unit volume and may exhibit a quantum confinement effect. A quantum dot may absorb light from an excitation source to be excited, and may emit energy corresponding to a bandgap energy of the quantum dot.

Quantum dots have potential applicability to, e.g., in, various electronic devices due to unique photoluminescence characteristics of the quantum dots. Quantum dots having properties that may be applicable to, e.g., used in, electronic devices and the like are may be cadmium-based quantum dots. However, cadmium may cause environment/health problems and thus is a restricted element. Cadmium-free quantum dots (hereinafter, also referred to as non-cadmium quantum dots) may be, e.g., include, for example a Group III-V-based nanocrystal. Non-cadmium quantum dots may have inferior photoluminescence properties (e.g., blue light absorption) and stability compared with cadmium-based quantum dots. Blue light (e.g., having a wavelength of about 450 nm) may be used as an energy excitation source for the quantum dot. Cadmium-based quantum dots may have high absorption intensity for blue light but in the case of non-cadmium-based quantum dots, an absorption intensity at, e.g., of, blue light (e.g., wavelength of about 450 nm) may not be high, and a display device including non-cadmium-based quantum dots may exhibit reduced luminance.

In a liquid crystal display (LCD) device, polarized light from a liquid crystal layer passes (through) an absorption type color filter and expresses a color and thus the liquid crystal display (LCD) device may have problems of a narrow viewing angle as well as a deteriorated luminance due to a low light transmittance of the absorption type color filter. A photoluminescent type color filter may be an alternative to overcome technical limits of the LCD device including the absorption type color filter. A quantum dot-based color filter may use blue light instead of white light as an excitation light, and a color filter may be disposed in front of the display device to convert the excitation light to the desirable light (e.g., green light/red light). Therefore, a quantum dot-based color filter may reduce, e.g., minimize or solve, technical problems of, for example, a liquid crystal display (e.g., narrow viewing angle and light loss). Light with linearity (passing through the liquid crystal layer and going straight) may be scattered in all directions, and this may reduce, e.g., minimize or solve, a viewing angle problem. The optical loss that may occur by using the absorption type color filter may also be reduced or minimized.

However, when employing a quantum dot-based color filter, the excitation light propagating in the forward direction of the display device (e.g., in a red or green light emitting section) may become a technical problem and it may be desirable to block the excitation light propagating in the forward direction of the device. Non-cadmium-based quantum dot (e.g., a InP/ZnSeS core/shell quantum dot) may not provide enough absorption to block excitation light propagating in the forward direction of the device.

The present inventors have found that an UV-Vis absorption spectrum peak of the core/shell quantum dot may be deconvolutionized into a first absorption peak originated from the energy bandgap of the indium phosphide and a second absorption peak originated from the InP and ZnSe, among which the second absorption peak may have an effect on the absorption rate at 450 nm. The present inventors have also found that the molar absorption coefficient of the quantum dot may be proportional to a quantum dot's volume contributing to the absorption thereof. Therefore, in order to achieve an increase of an absorption rate of a cadmium free quantum dot, an increased (e.g., InP) core volume may be desired. However, in the quantum dot, an increase of the core may also result in a substantial change in an emission wavelength of the quantum dot and for example, in order to realize the green light emission, it may not easy to increase the size of the (InP) core. The present inventors have also found that although the ZnSe shell may contribute to the absorption at 450 nm, its contribution may be exponentially decreased with an increase of a thickness thereof because the contribution of the portion of the ZnSe shell adjacent to the core is large.

The quantum dot(s) according to an embodiment may exhibit an increased blue light absorption rate together with the emission of desired wavelength at a relatively high luminous efficiency while not including cadmium. In an embodiment, the quantum dot of the embodiment may not include cadmium.

Referring to FIG. 1, a quantum dot of an embodiment includes a seed including a first semiconductor nanocrystal, and a quantum well layer ("well layer") disposed on the seed and including an alloy semiconductor nanocrystal. The quantum well layer may surround a portion of (or an entirety of) a surface of the seed. A shell including a second semiconductor nanocrystal may be disposed on the quantum well layer.

A bandgap energy of the alloy semiconductor nanocrystal is smaller, e.g., less, than a bandgap energy of the first semiconductor nanocrystal and smaller, e.g., less, than a bandgap energy of the second semiconductor nanocrystal (if present). Referring to FIG. 1, in an energy band alignment, a valence band edge and a conduction band edge of the alloy semiconductor nanocrystal may be within the bandgap of the first semiconductor nanocrystal. The valence band edge and the conduction band edge of the alloy semiconductor nanocrystal may be within the bandgap of the second semiconductor nanocrystal. A bandgap energy may be known for a bulk material (e.g., ZnSe, GaP, InP, ZnS, ZnSeS, or the like) or may be calculated therefrom.

The bandgap energy of the first semiconductor nanocrystal and the bandgap energy of the second semiconductor nanocrystal may be the same or different. In an embodiment, the bandgap energy of the first semiconductor nanocrystal may be less than the bandgap energy of the second semiconductor nanocrystal. In an embodiment, the bandgap energy of the first semiconductor nanocrystal may be greater than or equal to the bandgap energy of the second semiconductor nanocrystal.

The first semiconductor nanocrystal and the second semiconductor nanocrystal each independently include a zinc chalcogenide (e.g., a compound including zinc and a chalcogen element such as selenium, tellurium, sulfur, or a combination thereof). A first zinc chalcogenide included in the first semiconductor nanocrystal and a second zinc chalcogenide included in the second semiconductor nanocrystal may have the same composition with each other. The first zinc chalcogenide and the second zinc chalcogenide may have different compositions with each other.

The zinc chalcogenide (e.g., the first semiconductor nanocrystal or the second semiconductor nanocrystal) may include ZnSe, ZnTeSe, ZnSeS, ZnS, ZnTeS, or a combination thereof. The first semiconductor nanocrystal may include zinc and selenium. The first semiconductor nanocrystal may include ZnSe, ZnSeS, ZnTeSe, or a combination thereof. The first semiconductor nanocrystal may include ZnSe. In an embodiment, the first semiconductor nanocrystal may include zinc and sulfur.

In an embodiment, the second semiconductor nanocrystal may include zinc and sulfur. The second semiconductor nanocrystal may include ZnSeS, ZnS, or a combination thereof.

The shell may be a multi-layered shell. The multi-layered shell may include a first layer including a third zinc chalcogenide and a second layer disposed (e.g., directly) on the first layer and including a fourth zinc chalcogenide. The fourth zinc chalcogenide may include a different composition from the third zinc chalcogenide. The first layer and the second layer may be (e.g., directly) on (e.g., in contact with) each other. The first layer may be disposed directly on the quantum well layer. The first layer and the second layer may include zinc chalcogenides each having different compositions. The third zinc chalcogenide may include ZnSe, ZnTeSe, ZnSeS, ZnS, or a combination thereof, and the fourth zinc chalcogenide may independently include ZnSe, ZnTeSe, ZnSeS, ZnS, or a combination thereof. The first layer may include ZnSe, ZnSeS, or a combination thereof, and the second layer may include ZnS. The shell may have a structure of ZnSe/ZnS. The second shell may constitute, e.g., be, an outermost layer of the shell.

The quantum well layer may be disposed between the seed and the shell. The quantum well layer may be configured to absorb an excitation light (e.g., blue light) and to emit light (e.g., band-edge emission) that may be controlled depending on a bandgap energy thereof.

The quantum well layer include an alloy semiconductor nanocrystal including indium (In), phosphorus (P), and gallium (Ga). The alloy semiconductor nanocrystal may be a ternary alloy of InGaP. The quantum well layer may include a relatively homogenous alloy composition for example in a thickness direction of the quantum well layer.

In the quantum dot of an embodiment, a quantum well layer having a relatively narrow bandgap is disposed on a seed having a relatively wide bandgap, and a passivation shell may be coated on the quantum well layer. The quantum well layer may play a role of an emissive center. A colloidal semiconductor nanocrystal particle having such a quantum well structure (hereinafter, may also referred to as a quantum well (QW) quantum dot) may exhibit improved blue light absorption in comparison with a core-shell quantum dot having a similar structure. Without wishing to be bound by any theory, it is believed that the quantum well layer may realize, e.g., exhibit, increased volume in comparison with an emission core of the same composition, which may enhance the light absorption.

However, the present inventors have found that the QW quantum dot may tend to show, e.g., exhibit, a significant red shift in an emission wavelength of the QW quantum dot, which may make it difficult for the QW quantum dot to have a desired wavelength of light (e.g., in a green light region)

Without wishing to be bound by any theory, it is believed that the QW quantum dot may have an wider interface between the seed and the emission layer and an interface between the emission layer and the shell and a lattice mismatch (or a lattice parameter difference) therebetween, which may make it difficult to form a desired emission layer.

Surprisingly, the present inventors have found that by the introduction of the aforementioned alloy composition having a wider bandgap to the quantum well layer, the quantum dot of an embodiment may relieve a red shift problem substantially without adverse effect. The quantum dot of an embodiment may emit light of a desired wavelength with a relatively high level of an efficiency and thus when being included in a polymer composite film, it may exhibit an improved absorption rate together with a high level of a photoconversion rate (or a photoconversion efficiency).

In an embodiment, the quantum well layer may include a $In_{1-x}Ga_xP$ (x is greater than 0, greater than or equal to about 0.01, greater than or equal to about 0.05, greater than or equal to about 0.1, greater than or equal to about 0.15, greater than or equal to about 0.2, greater than or equal to about 0.25, greater than or equal to about 0.3, greater than or equal to about 0.35, greater than or equal to about 0.4, greater than or equal to about 0.45, greater than or equal to about 0.5, or greater than or equal to about 0.55 and less than about 1, less than or equal to about 0.95, less than or equal to about 0.9, less than or equal to about 0.85, less than or equal to about 0.8, less than or equal to about 0.75, less than or equal to about 0.7, or less than or equal to about 0.6).

In a quantum dot of an embodiment, the seed may include zinc and selenium and the quantum well layer may include $In_{1-x}Ga_xP$, and the shell may include zinc and sulfur. The shell may be a multi-layered shell and an outermost layer may include ZnS. The shell may further include selenium. As used herein, an amount of each component in the quantum dot may be measured (or determined) by using ICP analysis, X-ray photoelectron spectroscopy (XPS), or another appropriate measure.

In the quantum dot of an embodiment, a mole ratio of gallium with respect to a sum of indium and gallium may be greater than 0:1, greater than or equal to about 0.01:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, greater than or equal to about 0.5:1, or greater than or equal to about 0.55:1 and less than or equal to about 0.6:1, less than or equal to about 0.55:1, less than or equal to about 0.5:1, less than or equal to about 0.45:1, less than or equal to about 0.4:1, less than or equal to about 0.35:1, less than or equal to about 0.3:1, less than or equal to about 0.25:1, less than or equal to about 0.2:1, less than or equal to about 0.19:1, less than or equal to about 0.18:1, less than or equal to about 0.17:1, less than or equal to about 0.16:1, or less than or equal to about 0.15:1.

In the quantum dot of an embodiment, a total mole amount of the indium and the phosphorus may be (as determined by an appropriate analysis tool such as XPS, ICP, or the like) based on a total mole number of all elements of the quantum dot, less than or equal to about 20%, less than or equal to about 19%, less than or equal to about 18%, less than or equal to about 17%, less than or equal to about 16%, less than or equal to about 15%, less than or equal to about 14%, less than or equal to about 13%, less than or equal to about 12%, less than or equal to about 11%, less than or equal to about 10%, less than or equal to about 9%, less than or equal to about 8%, less than or equal to about 7%, less than or equal to about 6%, less than or equal to about 5%, less than or equal to about 4%, or less than or equal to about 3%. The total mole amount of the indium and the phosphorus may be, based on a total mole number of all elements of the quantum dot, greater than or equal to about 0.1%, greater than or equal to about 0.2%, greater than or equal to about 0.3%, greater than or equal to about 0.4%, greater than or equal to about 0.5%, greater than or equal to about 0.6%, greater than or equal to about 0.7%, greater than or equal to about 0.8%, greater than or equal to about 0.9%, greater than or equal to about 1%, 5%, greater than or equal to about 2%, greater than or equal to about 2.5%, greater than or equal to about 3%, or greater than or equal to about 3.5%.

In the quantum dot(s) of an embodiment, a mole ratio of zinc with respect to indium greater than or equal to about 7:1, greater than or equal to about 9:1, greater than or equal to about 10:1, greater than or equal to about 13:1, greater than or equal to about 15:1, greater than or equal to about 18:1, greater than or equal to about 20:1, greater than or equal to about 22:1, greater than or equal to about 23:1, greater than or equal to about 24:1, greater than or equal to about 25:1, greater than or equal to about 26:1, greater than or equal to about 27:1, greater than or equal to about 28:1, greater than or equal to about 29:1, or greater than or equal to about 30:1. In the quantum dot(s) of an embodiment, a mole ratio of zinc with respect to indium may be less than or equal to about 50:1, less than or equal to about 45:1, less than or equal to about 40:1, or less than or equal to about 35:1.

In the quantum dot(s) of an embodiment, a mole ratio of phosphorus with respect to indium may be greater than or equal to about 0.5:1, greater than or equal to about 0.51:1, greater than or equal to about 0.52:1, greater than or equal to about 0.53:1, greater than or equal to about 0.54:1, greater than or equal to about 0.55:1, greater than or equal to about 0.56:1, greater than or equal to about 0.57:1, greater than or equal to about 0.58:1, greater than or equal to about 0.59:1, greater than or equal to about 0.6:1, greater than or equal to about 0.65:1, greater than or equal to about 0.7:1, greater than or equal to about 0.75:1, or greater than or equal to about 0.8:1. In the quantum dot(s) of an embodiment, a mole ratio of phosphorus with respect to indium may be less than or equal to about 1.3:1, less than or equal to about 1.2:1, less than or equal to about 1.1:1, less than or equal to about 1.09:1, less than or equal to about 1.08:1, less than or equal to about 1.07:1, less than or equal to about 1.06:1, less than or equal to about 1.05:1, less than or equal to about 1.04:1, less than or equal to about 1.03:1, less than or equal to about 1.02:1, less than or equal to about 1.01:1, less than or equal to about 1:1, less than or equal to about 0.95:1, or less than or equal to about 0.85:1.

In the quantum dot(s) of an embodiment, a mole ratio of zinc with respect to a sum of indium and gallium (Zn:(In+Ga)) may be greater than or equal to about 10:1, greater than or equal to about 11:1, greater than or equal to about 12:1, greater than or equal to about 13:1, greater than or equal to about 14:1, greater than or equal to about 15:1, greater than or equal to about 16:1, greater than or equal to about 17:1, greater than or equal to about 18:1, greater than or equal to about 19:1, or greater than or equal to about 20:1 and less than or equal to about 40:1, less than or equal to about 35:1, less than or equal to about 30:1, less than or equal to about 28:1, less than or equal to about 26:1, or less than or equal to about 25:1.

In an embodiment, the first semiconductor nanocrystal and the second semiconductor nanocrystal may include selenium. In the quantum dot(s) of an embodiment, a mole ratio of selenium with respect to a sum of indium and gallium (Se:(In+Ga)) may be less than or equal to about 20:1, less than or equal to about 19:1, less than or equal to about 18:1, less than or equal to about 17:1, less than or equal to about 16:1, less than or equal to about 15:1, or less than or equal to about 14:1. In the quantum dot(s) of an embodiment, a mole ratio of selenium with respect to a sum of indium and gallium (Se:(In+Ga)) may be greater than or equal to about 5:1, greater than or equal to about 7:1, greater than or equal to about 9:1, greater than or equal to about 10:1, greater than or equal to about 11:1, greater than or equal to about 12:1, greater than or equal to about 12.5:1, or greater than or equal to about 13:1.

In the quantum dot(s) of an embodiment, a mole ratio of sulfur with respect to selenium may be greater than or equal to about 0.1:1, greater than or equal to about 0.2:1, greater than or equal to about 0.3:1, greater than or equal to about 0.4:1, or greater than or equal to about 0.5:1. In the quantum dot(s) of an embodiment, a mole ratio of sulfur with respect to selenium may be less than or equal to about 1:1, less than or equal to about 0.9:1, less than or equal to about 0.8:1, less than or equal to about 0.7:1, or less than or equal to about 0.6:1.

In the quantum dot(s) of an embodiment, a mole ratio of selenium with respect to indium may be greater than or equal to about 5:1, greater than or equal to about 7:1, greater than or equal to about 10:1, or greater than or equal to about 12:1. In the quantum dot(s) of an embodiment, a mole ratio of selenium with respect to indium may be less than or equal to about 20:1, less than or equal to about 19:1, less than or equal to about 18:1, less than or equal to about 17:1, less than or equal to about 16:1, or less than or equal to about 15:1.

In the quantum dot(s) of an embodiment, a mole ratio of sulfur with respect to indium may be greater than or equal to about 4:1, greater than or equal to about 5:1, greater than or equal to about 6:1, or greater than or equal to about 7:1. In the quantum dot(s) of an embodiment, a mole ratio of sulfur with respect to indium may be less than or equal to about 15:1, less than or equal to about 14:1, less than or equal to about 13:1, less than or equal to about 12:1, or less than or equal to about 11:1.

A size (e.g., a diameter or an equivalent diameter) of the seed or a thickness of the quantum well layer may be controlled taking into consideration a desired wavelength and a composition of the quantum dot. In the quantum dot of an embodiment, a size of the seed may be greater than or equal to about 0.8 nm, greater than or equal to about 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, greater than or equal to about 1.9 nm, greater than or equal to about 2 nm, greater than or equal to about 2.1 nm, greater than or equal to about 2.2 nm, greater than or equal to about 2.3 nm, greater than or equal to about 2.4 nm, greater than or equal to about 2.5 nm, greater than or equal to about 2.6 nm, greater than or equal to about 2.7 nm, greater than or equal to about 2.8 nm, greater than or equal to about 2.9 nm, or greater than or equal to about 3.0 nm. The size of the seed may be less than or equal to about 5 nm, less than or equal to about 4 nm, less than or equal to about 3.5 nm, less than or equal to about 3.45 nm, less than or equal to about 3.4 nm, less than or equal to about 3.3 nm, less than or equal to about 3.2 nm, less than or equal to about 3.1 nm, less than or equal to about 3 nm, less than or equal to about 2.9 nm, less than or equal to about 2.8 nm, less than or equal to about 2.7 nm, less than or equal to about 2.6 nm, less than or equal to about 2.5 nm, less than or equal to about 2.4 nm, less than or equal to about 2.3 nm, less than or equal to about 2.2 nm, less than or equal to about 2.1 nm, or less than or equal to about 2 nm.

A thickness of the quantum well layer may be greater than or equal to about 0.05 nm, greater than or equal to about 0.1 nm, greater than or equal to about 0.15 nm, greater than or equal to about 0.2 nm, greater than or equal to about 0.25 nm, greater than or equal to about 0.3 nm, greater than or equal to about 0.35 nm, greater than or equal to about 0.4 nm, greater than or equal to about 0.45 nm, or greater than or equal to about 0.5 nm. A thickness of the quantum well layer may be less than or equal to about 1.5 nm, less than or equal to about 1.4 nm, less than or equal to about 1.35 nm, less than or equal to about 1.33 nm, less than or equal to about 1.32 nm, less than or equal to about 1.31 nm, less than or equal to about 1.3 nm, less than or equal to about 1.2 nm, less than or equal to about 1.1 nm, less than or equal to about 1.0 nm, less than or equal to about 0.9 nm, less than or equal to about 0.8 nm, less than or equal to about 0.7 nm, less than or equal to about 0.6 nm, less than or equal to about 0.5 nm, or less than or equal to about 0.35 nm.

A thickness of the shell may be greater than or equal to about 0.3 nm, greater than or equal to about 0.4 nm, greater than or equal to about 0.5 nm, greater than or equal to about 0.6 nm, greater than or equal to about 0.7 nm, greater than or equal to about 0.8 nm, greater than or equal to about 0.9 nm, greater than or equal to about 1 nm, greater than or equal to about 1.1 nm, greater than or equal to about 1.2 nm, greater than or equal to about 1.3 nm, greater than or equal to about 1.4 nm, or greater than or equal to about 1.5 nm and less than or equal to about 4 nm, less than or equal to about 3.5 nm, less than or equal to about 3.0 nm, less than or equal to about 2.9 nm, less than or equal to about 2.8 nm, less than or equal to about 2.7 nm, less than or equal to about 2.6 nm, less than or equal to about 2.4 nm, less than or equal to about 2.3 nm, less than or equal to about 2.2 nm, less than or equal to about 2.1 nm, less than or equal to about 2.0 nm, less than or equal to about 1.5 nm, less than or equal to about 1 nm, less than or equal to about 0.8 nm, or less than or equal to about 0.6 nm.

In an embodiment, a size (or an average size) of the quantum dot(s) may be greater than or equal to about 3 nm, greater than or equal to about 4 nm, greater than or equal to about 5 nm, or greater than or equal to about 6 nm. In an embodiment, a size (or an average size) of the quantum dot(s) may be less than or equal to about 20 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 10 nm, less than or equal to about 9 nm, less than or equal to about 8 nm, less than or equal to about 7 nm, less than or equal to about 6 nm, or less than or equal to about 5 nm. The size of the quantum dots may be a particle diameter. The size of the quantum dots may be a diameter or an equivalent diameter calculated by converting a two-dimensional area identified by transmission electron. As used herein, a dimension such as a size (e.g., a quantum dot-related dimension) may refer to an average (mean or median average) value thereof (e.g., an average size).

The quantum dot may constitute, e.g., be include in, a population of quantum dots emitting green light. An average size of the population of the quantum dots may be greater than or equal to about 3 nm, greater than or equal to about 3.5 nm, greater than or equal to about 4 nm, greater than or equal to about 4.5 nm, greater than or equal to about 5.5 nm, greater than or equal to about 5.6 nm, greater than or equal to about 5.7 nm, greater than or equal to about 5.8 nm, greater than or equal to about 5.9 nm, or greater than or equal to about 6.0 nm. In an embodiment, the quantum dots or the population of the quantum dots may have a size (or an average size) of less than or equal to about 30 nm, less than or equal to about 25 nm, less than or equal to about 20 nm, less than or equal to about 15 nm, less than or equal to about 14 nm, less than or equal to about 13 nm, less than or equal to about 12 nm, less than or equal to about 11 nm, or less than or equal to about 10 nm.

In an embodiment, the population of the quantum dots may have a particle size distribution of less than or equal to about 20%, less than or equal to about 19%, less than or equal to about 18%, less than or equal to about 17%, less than or equal to about 16%, or less than or equal to about 15% of an average size as a standard deviation.

In an embodiment, the quantum dot may include an organic ligand on a surface thereof. The organic ligand may include RCOOH, RNH$_2$, R$_2$NH, R$_3$N, RSH, RH$_2$PO, R$_2$HPO, R$_3$PO, RH$_2$P, R$_2$HP, R$_3$P, ROH, RCOOR, RPO(OH)$_2$, RPOOH, RHPOOH, R$_2$POOH, or a combination thereof (wherein, R is the same or different and each independently a C1 to C40 aliphatic hydrocarbon group (e.g., a C1 to C40 or a C3 to C24 alkyl group, a C2 to C40 or a C3 to C24 alkenyl group, a C2 to C40 or a C3 to C24 alkynyl group), or a C6 to C40 aromatic hydrocarbon group (e.g., a C6 to C20 aryl group)), or a combination thereof.

The organic ligand may coordinate, e.g., to or be bound to, the surface of the obtained nanocrystal and may help the nanocrystal to be well dispersed in the solution, affect light emitting and electrical characteristics of quantum dots, or a combination thereof.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, a triphenyl phosphine, or an oxide thereof; a C5 to C20 alkylphosphinic acid or a C5 to C20 alkyl phosphonic acid such as phosphonic acid, hexylphosphinic acid, octylphosphinic acid, dodecanephosphinic acid, tetradecanephosphinic acid, hexadecanephosphinic acid, or octadecanephosphinic acid; and the like, but are not limited thereto. Two or more different organic ligands may be used. The organic ligand may include a mixture of a carboxylic acid compound and an amine compound.

In the quantum dot according to an embodiment, a UV-Vis absorption spectrum curve of the quantum dot may not have an inflection point or a valley (i.e., a point wherein a slope of a tangent line of the curve is changed from a negative value to a positive value) in a wavelength range of greater than or equal to about 390 nm, greater than or equal to about 400 nm, greater than or equal to about 410 nm, greater than or equal to about 415 nm, greater than or equal to about 420 nm, greater than or equal to about 425 nm, greater than or equal to about 430 nm, greater than or equal to about 435 nm, greater than or equal to about 440 nm, greater than or equal to about 445 nm, greater than or equal to about 450 nm, greater than or equal to about 455 nm, greater than or equal to about 460 nm, greater than or equal to about 465 nm, greater than or equal to about 470 nm, greater than or equal to about 475 nm, greater than or equal to about 480 nm, greater than or equal to about 485 nm, or greater than or equal to about 490 nm and less than or equal to about 620 nm, or less than or equal to about 550 nm, less than or equal to about 540 nm, less than or equal to about 530 nm, less than or equal to about 520 nm, less than or equal to about 510 nm, less than or equal to about 500 nm, less than or equal to about 495 nm, less than or equal to about 490 nm, less than or equal to about 485 nm, less than or equal to about 480 nm, less than or equal to about 475 nm, less than or equal to about 470 nm, less than or equal to about 465 nm, less than or equal to about 460 nm, less than or equal to about 455 nm, less than or equal to about 450 nm, less than or equal to about 445 nm, less than or equal to about 440 nm, less than or equal to about 435 nm, less than or equal to about 430 nm, less than or equal to about 425 nm, or less than or equal to about 420 nm (or a combined range of limit values as recited). In an embodiment, the UV-Vis absorption spectrum curve of the quantum dot may not have a first absorption peak. Without wishing to be bound by any theory, it is believed that by the inclusion of the alloy semiconductor nanocrystal in the quantum well layer, the quantum dot may have a UV-Vis absorption spectrum without an inflection point in the aforementioned wavelength range.

As used herein, the inflection point is a point on a curve at which the concavity changes. In an embodiment, the inflection point may be a point on a continuously differentiable plane curve at which the curve crosses a tangent of the curve. In an embodiment, the curve may exhibit a change from concave downward to convex or concave upward, or vice versa.

Without wishing to be bound by any theory, it is believed that the aforementioned UV-Vis absorption spectrum may suggest that the emission region of a quantum dot of an embodiment is present in the quantum well layer including the alloy semiconductor nanocrystal (unlike the core-shell structure quantum dot), and thus the quantum dot(s) showing, e.g., exhibiting, the disclosed UV-vis absorption spectrum may exhibit an increased blue light absorption together with an increased quantum efficiency.

In the quantum dots of an embodiment, the alloy semiconductor nanocrystal may be included in the quantum well layer, and thus lattice mismatches at interfaces between the seed and the quantum well layer and between the quantum well layer and the shell may be relieved, and a bandgap energy of the well layer may be controlled so that a thickness of the quantum well layer for a desired emission wavelength may increase. The quantum dot of an embodiment may address a noticeable red shift problem (that may otherwise occur in a final QW structure) substantially without causing adverse effect on luminous properties (e.g., a quantum efficiency).

The quantum dot of an embodiment may emit light (e.g., green light or red light) having a wavelength of a desired range.

The quantum dot or the green light may have a maximum luminescent peak wavelength in a range of greater than or equal to about 490 nm, greater than or equal to about 495 nm, greater than or equal to about 500 nm, greater than or equal to about 505 nm, greater than or equal to about 510 nm, greater than or equal to about 515 nm, or greater than or equal to about 520 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm.

The quantum dot or the red light may have a maximum luminescent peak wavelength in a range of greater than or equal to about 600 nm, greater than or equal to about 605 nm, greater than or equal to about 610 nm, greater than or equal to about 615 nm, or greater than or equal to about 620 nm and less than or equal to about 650 nm, less than or equal to about 645 nm, less than or equal to about 640 nm, less than or equal to about 635 nm, or less than or equal to about 620 nm.

The quantum dot of an embodiment (or a maximum luminescent peak thereof) may show, e.g., exhibit, a full width at half maximum of less than or equal to about 100 nm, less than or equal to about 80 nm, less than or equal to about 70 nm, less than or equal to about 60 nm, less than or equal to about 50 nm, less than or equal to about 40 nm, or less than or equal to about 35 nm.

The quantum dot of an embodiment may have a quantum efficiency of greater than or equal to about 60%, greater than or equal to about 65%, greater than or equal to about 70%, or greater than or equal to about 75%.

The quantum dot according to an embodiment may be prepared by a colloid synthesis, and thus may include an organic ligand, an organic solvent, or a combination thereof as described herein on a surface of the quantum dot. The organic ligand, the organic solvent, or a combination thereof may be bound to a surface of the quantum dot.

In an embodiment, a method of producing the aforementioned quantum dot(s) includes obtaining a seed including a first semiconductor nanocrystal; forming a quantum well layer including an alloy semiconductor nanocrystal; and forming a shell including a second semiconductor nanocrystal on the quantum well layer.

Details of the seed, the quantum well layer, and the shell are the same as described herein. Depending on the composition of the seed, the quantum well layer, and the shell, metal and non-metal precursors may be selected appropriately. The metal precursor may include a metal powder, alkylated metal, a metal carboxylate, a metal hydroxide, a metal halide, a metal oxide, a metal inorganic salt (e.g., a metal nitrate, etc.), a metal sulfate, a metal acetylacetonate, or a combination thereof, but is not limited thereto. The non-metal precursor may include a non-nitrogen containing compound used in quantum dot synthesis.

Hereinafter, a production of a quantum dot including a seed including a first semiconductor nanocrystal including zinc selenide, a quantum well including a second semiconductor nanocrystal including indium, phosphorus, and gallium, and a shell including zinc and a chalcogen element (e.g., sulfur, selenium, or a combination thereof) is described, but the present disclosure is not limited thereto.

For the formation of the seed, a zinc precursor and a selenium precursor may be reacted in an organic solvent in the presence of an organic ligand. The method may further include separating the formed seed.

Details of the organic ligand are the same as set forth herein. The organic solvent may be a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, or benzyl ether, or a combination thereof. A type and an amount of the organic solvent may be appropriately selected taking into consideration the precursor(s) and organic ligand(s).

The formed seed may be separated by addition of a nonsolvent, but is not limited thereto. For example, the addition of a nonsolvent to the prepared final reaction solution may allow nanocrystals coordinated with, e.g., bound to, the organic ligands to be separated (e.g., precipitated). The separated seeds may be washed using the nonsolvent. The nonsolvent may be a polar solvent that is miscible with the solvent used in the reaction and nanocrystals are not dispersible therein.

The nonsolvent may be selected depending on the organic solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the organic ligand may be used. Examples thereof may include hexane, heptane, octane, chloroform, toluene, and benzene.

For the formation of the quantum well, an indium precursor, a phosphorus precursor, and a gallium precursor may be added to a reaction medium including an organic solvent, in the presence of the seed, and optionally an organic ligand, simultaneously or sequentially, and reacted therein. In the formation of the quantum well, types and amounts of metal/non-metal precursors may be selected taking into consideration a composition and a thickness of the quantum well. An amount of the gallium precursor that is added to the reaction medium per one mole of indium may be greater than or equal to about 0.05 moles, greater than or equal to about 0.1 moles, greater than or equal to about 0.15 moles, greater than or equal to about 0.2 moles, greater than or equal to about 0.25 moles, greater than or equal to about 0.3 moles, greater than or equal to about 0.35 moles, greater than or equal to about 0.4 moles, or greater than or equal to about 0.5 moles. An amount of the gallium precursor that is added to the reaction medium per one mole of indium may be less than or equal to about 1 mole, less than or equal to about 0.9 moles, less than or equal to about 0.8 moles, less than or equal to about 0.7 moles, less than or equal to about 0.6 moles, less than or equal to about 0.5 moles, or less than or equal to about 0.4 moles.

In an embodiment, the amounts of the precursors for the formation of the well layer may be adjusted in order to control the composition and the thickness of the quantum well layer. In an embodiment, similar to the formation of the seed, a particle in which the quantum well layer is formed may be separated by adding a nonsolvent to a reaction system. In an embodiment, the particle including the quantum well layer may be subjected to a shell formation reaction without the separation.

A zinc precursor and a chalcogen precursor may be reacted to form a shell having a desired composition on a particle having the formed quantum well layer. For the formation of the multi-layered shell, a desired combination of the shell precursors may be added simultaneously or sequentially to the reaction system to carry out a reaction for forming each layer of the shell.

A reaction temperature in each step set forth herein may be selected taking into consideration types of precursor compounds, an organic ligand, an organic solvent.

A reaction time for the formation of the seed, formation of the quantum well layer, formation of the shell, or a combination thereof may be controlled taking into consideration a reactivity between the precursors, a reaction temperature, and a desired thickness or size of a layer or a particle. The reaction temperature may be greater than or equal to about 200° C., for example, greater than or equal to about 210° C., greater than or equal to about 220° C., greater than or equal to about 230° C., greater than or equal to about 240° C., greater than or equal to about 250° C., greater than or equal to about 260° C., greater than or equal to about 270° C., greater than or equal to about 280° C., greater than or equal to about 290° C., or greater than or equal to about 300° C. and less than or equal to about 360° C., less than or equal to about 350° C., or less than or equal to about 340° C., less than or equal to about 330° C., or less than or equal to about 320° C. The reaction time in each step may be less than or equal to about 2 hours, less than or equal to about 1 hour, or less than or equal to about 50 minutes. The reaction time may be greater than or equal to about 20 minutes, for example, greater than or equal to about 30 minutes.

In each of the aforementioned steps, a type, an amount, or a combination thereof of the precursors or a ratio therebetween may be determined by taking into consideration a composition thereof in a final quantum dot (a seed, a quantum well, and a shell), reactivity thereof, and the like.

Each of the aforementioned steps (e.g., the formation of the seed, the formation of the quantum well layer, and the formation of the shell) may include heating (or vacuum-treating) the organic solvent and the metal precursor optionally with a ligand compound at a predetermined temperature (e.g., greater than or equal to about 100° C.) under vacuum and heating them again at a predetermined temperature (e.g., greater than or equal to about 100° C.) after converted into an inert gas atmosphere.

The injection of the metal precursor, the non-metal precursor, or a combination thereof may be made sequentially or simultaneously and a temperature of the injection may be selected appropriately. In an embodiment, during the formation of the multi-layered shell or a multi-layered quantum well, the metal precursors, the non-metal precursors, or a combination thereof may be added in a different ratio (over) several times during the reaction time.

The precursor is not particularly limited and may be appropriately selected. In an embodiment, the zinc precursor may be appropriately selected.

In an embodiment, types of the zinc precursor may be selected appropriately. Examples of the zinc precursor may be a Zn metal powder, an alkylated Zn compound (e.g., dimethyl zinc, diethyl zinc, etc.), Zn alkoxide, Zn carboxylate (e.g., a reaction product between a zinc compound and a carboxylic acid compound having a C8 to C40 alkyl group, such as zinc oleate, zinc laurate, zinc stearate, or the like), Zn nitrate, Zn perchlorate, Zn sulfate, Zn acetylacetonate, Zn halide, Zn cyanide, Zn hydroxide, Zn oxide, Zn peroxide, or a combination thereof. Two or more different zinc precursor may be used.

The selenium precursor may include selenium-trioctylphosphine (Se-TOP), selenium-tributylphosphine (Se-TBP), selenium-triphenylphosphine (Se-TPP), selenium-diphenylphosphine (Se-DPP), or a combination thereof, but is not limited thereto.

The indium precursor may be appropriately selected. Examples of the indium precursor may be trimethyl indium, an indium carboxylate of C1 or greater, C5 or greater, C10 or greater, or C12 or greater such as indium acetate, indium palmitate, or indium stearate, indium hydroxide, indium chloride, indium oxide, indium nitrate, indium sulfate, indium laurate, or a combination thereof.

The phosphorus precursor may be appropriately selected. Examples of the phosphorus precursor may be tris(trimethylsilyl)phosphine, tris(dimethylamino) phosphine, triethylphosphine, tributylphosphine, trioctylphosphine, triphenylphosphine, tricyclohexylphosphine, or a combination thereof.

The sulfur precursor may be appropriately selected. The sulfur precursor may be a C6 to C20 alkyl (or alkenyl) thiol compound (having a, e.g., at least one thiol group), such as hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), bistrimethylsilyl sulfide, ammonium sulfide, sodium sulfide, or a combination thereof.

The gallium precursor may be selected appropriately. The gallium precursor may include a gallium chloride, a gallium acetylacetonate, a gallium fluoride, a gallium oxide, a gallium nitrate, a gallium sulfate, a gallium bromide, a gallium iodide, or a combination thereof.

In an embodiment, a composition may include (e.g., a plurality of) the aforementioned quantum dot(s); and an (organic) solvent, a liquid vehicle, or a combination hereof. The composition may optionally include a monomer, a dispersing agent, or a combination thereof. The dispersing agent may disperse the quantum dots. The composition may further include a carboxylic acid group-containing compound (e.g., a monomer or a binder polymer). The composition may further include a (photo) polymerizable monomer including a carbon-carbon double bond, and optionally a (thermal or photo) initiator. The composition may be a photosensitive composition.

Details of the quantum dots in the composition are as described herein. An amount of quantum dots in the composition may be appropriately adjusted in view of the desired end use (e.g., a color filter, etc.). In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a solid content of composition. The amount of the quantum dots may be less than or equal to about 70 wt %, for example, less than or equal to about 65 wt %, less than or equal to about 60 wt %, less than or equal to about 55 wt %, or less than or equal to about 50 wt %, based on a solid content of the composition. The weight percentage of the components relative to the total solids content in the composition may represent the contents of the components in the composite, which will be described herein.

The composition according to an embodiment may be used to provide a pattern of a quantum dot composite (e.g., a quantum dot-polymer composite pattern). The composition according to an embodiment may be a photoresist composition including quantum dots that may be applicable to a photolithography method. The composition according to an embodiment may be an ink composition that may provide a pattern by printing (e.g., a droplet discharge method such as inkjet printing).

In the composition according to an embodiment, the dispersing agent may ensure dispersibility of the quantum dots and optionally a metal oxide particulate that is described herein. In an embodiment, the dispersing agent may include a carboxylic acid group-containing compound (monomer or polymer). The binder may include a carboxylic acid group-containing compound. The dispersing agent or the binder may be an insulating polymer.

The carboxylic acid group-containing compound may include a monomer combination or a copolymer thereof including a first monomer including a carboxylic acid group and a carbon-carbon double bond, a second monomer having a carbon-carbon double bond, and a hydrophobic moiety and not including a carboxylic acid group, and optionally a third monomer including a carbon-carbon double bond and a hydrophilic moiety and not including a carboxylic acid group; a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, cardo binder); or a combination thereof. The dispersing agent may include the first monomer, the second monomer, and optionally the third monomer.

In the composition, an amount of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or the solid content) of the composition, but is not limited thereto. The amount of the binder polymer may be less than or equal to about 55 wt %, for example less than or equal to about 50 wt %, less than or equal to about 40 wt %, less than or equal to about 35 wt %, for example less than or equal to about 33 wt %, or less than or equal to about 30 wt %, based on a total weight (or the solid content) of the composition. The amount of the binder polymer may be about 0.5 wt % to about 55 wt %, based on a total weight of a solid content of the composition.

In the composition, the polymerizable (e.g., photopolymerizable) monomer (hereinafter, may be referred to as "monomer") including the carbon-carbon double bond may include (e.g., photopolymerizable) (meth)acryl-based monomer. The monomer may be a precursor for an insulating polymer.

An amount of the monomer may be greater than or equal to about 0.5 wt %, for example, greater than or equal to about 1 wt %, or greater than or equal to about 2 wt %, based on a total weight of the composition. The amount of the monomer may be less than or equal to about 30 wt %, for example, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on a total weight of the composition.

The (photo)initiator included in the composition is a compound that initiates (photo)polymerization of the aforementioned monomers in the composition. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, an amount of the initiator may be appropriately adjusted taking into consideration types and amounts of the polymerizable monomers. In an embodiment, the amount of the initiator may be greater than or equal to about 0.01 wt %, for example, greater than or equal to about 1 wt % and less than or equal to about 10 wt %, for example, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition, but is not limited thereto.

The composition (or the polymer matrix that will be described herein) may further include a (multiple or mono-functional) thiol compound having a, e.g., at least one, thiol group for example, at a terminal end thereof, a metal oxide particulate, or a combination thereof.

The metal oxide particulate may include $TiO_2$, $SiO_2$, $BaTiO_3$, $Ba_2TiO_4$, ZnO, or a combination thereof. In the composition, an amount of the metal oxide particulate may be greater than or equal to about 1 wt %, greater than or equal to about 5 wt %, or greater than or equal to about 10 wt % and less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %, based on a total weight (or a solid content thereof) of the composition.

The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1000 nm or less than or equal to about 800 nm.

The thiol compound may be a dithiol compound, a trithiol compound, a tetrathiol compound, or a combination thereof. For example, the thiol compound may be glycoldi-3-mercaptopropionate, glycoldimercaptoacetate, trimethylolpropane-tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on a total weight (or a total weight of the solid content) of the composition. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight (or a total weight of the solid content) of the composition.

The composition may further include an organic solvent (or a liquid vehicle, hereinafter referred to as a solvent). Types of the usable organic solvent are not particularly limited.

Examples of the solvent may include, but are not limited to: ethyl 3-ethoxy propionate; an ethylene glycol series such as ethylene glycol, diethylene glycol, or polyethylene glycol; a glycol ether series such as ethylene glycol monomethyl ether, ethylene glycol monoethyl ether, diethylene glycol monomethyl ether, ethylene glycol diethyl ether, or diethylene glycol dimethyl ether; glycol ether acetates series such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether series such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate series such as propylene glycol monomethyl ether acetate or dipropylene glycol monomethyl ether acetate; an amide series such as N-methylpyrrolidone, dimethyl formamide, or dimethyl acetamide; a ketone series such as methyl ethyl ketone (MEK), methyl isobutyl ketone (MIBK), or cyclohexanone; a petroleum product such as toluene, xylene, or solvent naphtha; an ester series such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

Types and amounts of the solvent may be appropriately selected by taking into consideration the aforementioned main components (i.e., the quantum dot, the dispersing agent, the photopolymerizable monomer, the photoinitiator, and if used, the thiol compound), and types and amounts of additives which will be described herein. The composition may include a solvent in a residual amount except for a desired amount of the solid content (non-volatile components).

The composition (e.g., an ink jet composition) may have a viscosity at 25° C. of greater than or equal to about 4 centiPoise (cPs), greater than or equal to about 5 cPs, greater than or equal to about 5.5 cPs, greater than or equal to about 6.0 cPs, or greater than or equal to about 7.0 cPs. The composition (e.g., an ink jet composition) may have a viscosity at 25° C. of less than or equal to about 12 cPs, less than or equal to about 10 cPs, or less than or equal to about 9 cPs.

If the composition is applied in an ink jet process, the composition may be discharged onto a substrate at room temperature and may form a quantum dot polymer composite or a pattern of quantum dot polymer composite, for example, by heating. Together with the disclosed viscosity, the ink composition may have a surface tension at 23° C. of greater than or equal to about 21 milliNewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 37 mN/m, less than or equal to about 36 mN/m, less than or equal to about 35 mN/m, less than or equal to about 34 mN/m, less than or equal to about 33 mN/m, or less than or equal to about 32 mN/m. A surface tension of the ink composition may be less than or equal to about 31 mN/m, less than or equal to about 30 mN/m, less than or equal to about 29 mN/m, or less than or equal to about 28 mN/m.

If desired, the composition may further include various additives such as a light diffusing agent, a leveling agent, or a coupling agent in addition to the aforementioned components.

The components (binder, monomer, solvent, additive, thiol compound, cardo binder, etc.) included in the composition (e.g., a photoresist composition) of an embodiment may be appropriately selected, for details described in, for example, US-2017-0052444-A1 may be referred.

The composition according to an embodiment may be prepared by a method including preparing quantum dot dispersion including the aforementioned quantum dots, dispersing agent, and solvent; and mixing the quantum dot dispersion with the initiator, the polymerizable monomer (e.g., acryl-based monomer), optionally, the thiol compound, optionally, the metal oxide particulates, and optionally, the aforementioned additive. Each of the aforementioned components may be mixed sequentially or simultaneously, but mixing orders are not particularly limited.

The composition may provide a quantum dot-polymer composite by a (e.g., radical) polymerization.

In an embodiment, the quantum dot (polymer) composite includes a polymer matrix; and the aforementioned quantum dot dispersed in the polymer matrix. The (polymer) matrix may include a linear polymer, a crosslinked polymer, or a combination thereof. The crosslinked polymer may include a thiolene resin, crosslinked poly(meth)acrylate, crosslinked polyurethane, a crosslinked epoxy resin, a crosslinked vinyl polymer, a crosslinked silicone resin, or a combination thereof. The linear polymer may include a repeating unit derived from carbon-carbon unsaturated bonds (e.g., carbon-carbon double bond). The repeating unit may include a carboxylic acid group. The linear polymer may include an ethylene repeating unit.

The polymer matrix may include a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), optionally a polymerization product of the polymerizable monomer and a thiol compound (e.g., a polythiol compound having at least two thiol groups for example, at a terminal end thereof), or a combination thereof. The quantum dot-polymer composite may further include the aforementioned metal oxide particulate.

In an embodiment, the polymer matrix may include a cross-linked polymer and a dispersing agent (e.g., (carboxyl group-contained) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, a polythiol compound having at least two thiols (e.g., at a terminal end thereof).

The quantum dot, the dispersing agent, or the binder polymer, the polymerizable monomer, and the polythiol compound may be the same as described herein.

A film of the quantum dot-polymer composite (or a pattern thereof as described herein) may have for example a thickness of less than or equal to about 30 μm, for example, less than or equal to about 25 μm, less than or equal to about 20 μm, less than or equal to about 15 μm, less than or equal to about 10 μm, less than or equal to about 8 μm, or less than or equal to about 7 μm and greater than or equal to about 2 μm, for example, greater than or equal to about 3 μm, greater than or equal to about 3.5 μm, greater than or equal to about 4 μm, greater than or equal to about 5 μm, or greater than or equal to about 6 μm.

In an embodiment, a patterned film includes a repeating section including a first section configured to emit first light, wherein the first section includes the aforementioned quantum dot (polymer) composite. The repeating section may include a second section emitting a second light having different wavelength from the first light, wherein the second section may include a quantum dot polymer composite. The quantum dot polymer composite of the second section may include a second quantum dot configured to emit the second light. The second quantum dot may include the aforementioned quantum dots. The first light or the second light may be red light having a maximum photoluminescence peak wavelength that is between about 600 nm and about 650 nm (e.g., about 620 nm to about 650 nm), or green light having a maximum photoluminescence peak wavelength that is between about 500 nm and about 550 nm (e.g., about 510 nm to about 540 nm). The patterned film may further include a third section emitting a third light (e.g., blue light) different from the first light and the second light. The third light may have a maximum peak wavelength ranging from about 380 nm to about 480 nm. The third section can allow the blue excitation light to pass through the patterned film of the quantum dot polymer composite, as disclosed herein In an embodiment, a display device includes a luminescent element (e.g., a photoluminescent element), and optionally a light source. The luminescent element includes a light emitting layer, and the light emitting layer includes a film or a patterned film of the quantum dot-polymer composite. The light emitting layer may be disposed on a (e.g., transparent) substrate. The light source is configured to provide the photoluminescent element with incident light. The incident light may have a luminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 2:
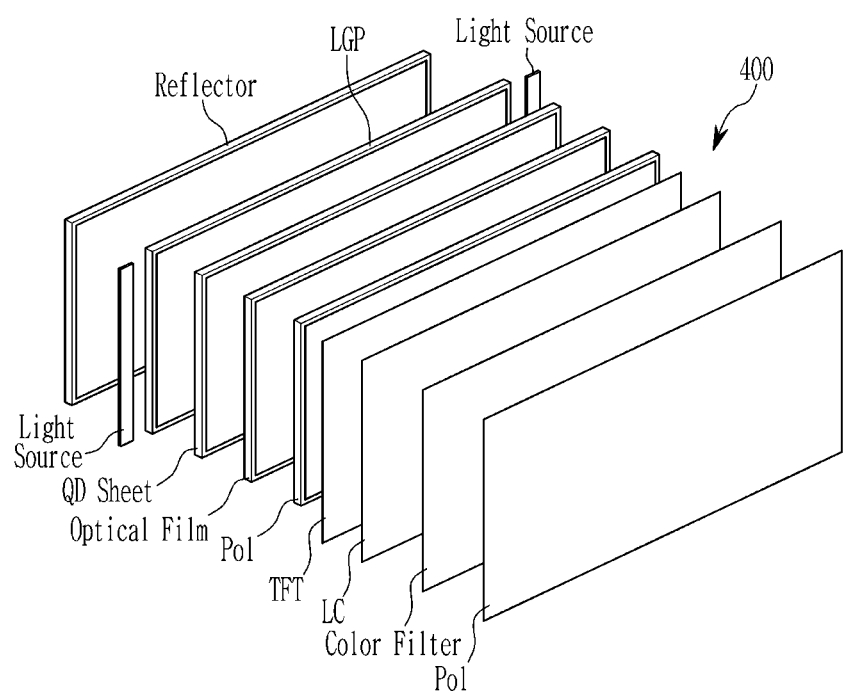
FIG. 2 is an exploded view of a display device according to an embodiment.

In an embodiment, the light emitting element, or the light emission layer, may include a sheet of the quantum dot polymer composite. Referring to FIG. 2, a device 400 of a photoluminescent type may include a backlight unit and a liquid crystal panel (LC) and the backlight unit may include the sheet of the quantum dot polymer composite (QD sheet). The backlight unit may have a structure wherein a reflector, a light guide panel (LGP) and a blue LED light source (Blue-LED), the quantum dot-polymer composite sheet (QD sheet), and various optical films such as a prism, dual brightness enhancement film (DBEF), and the like are stacked, and a liquid crystal panel is disposed on the backlight unit. A thin film transistor (TFT), a liquid crystal (LC), and a color filter may be disposed between two polarizers (pol). The quantum dot polymer composite (QD sheet) may include red quantum dots and green quantum dots that absorbs light from the light source and emits red and green light, respectively. Blue light provided from the light source passes through the quantum dot polymer composite sheet and combined with the red and green lights emitted from the quantum dots is converted into white light. The white light may be separated into a blue light, a green light, and a red light by a color filter in the liquid crystal panel and extracted outside according to the pixel.

In the light emitting layer (e.g., patterned film of quantum dot polymer composite) of the display device according to an embodiment, the first section may be a section emitting red light, and the second section may be a section emitting green light, and the light source may be an element emitting blue light and optionally green light.

In an embodiment, on a front side (i.e., light emitting face) of the first section and the second section may be disposed a first optical element cutting (e.g., absorbing or reflecting) blue light and optionally green light.

In the aforementioned display device, the light source includes a plurality of light emitting units respectively corresponding to the first section and the second section, and the light emitting units may include a first electrode and a second electrode each having a surface opposite the other and an electroluminescence layer disposed between the first electrode and the second electrode. The electroluminescence layer may include an organic light emitting material. For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 3A:
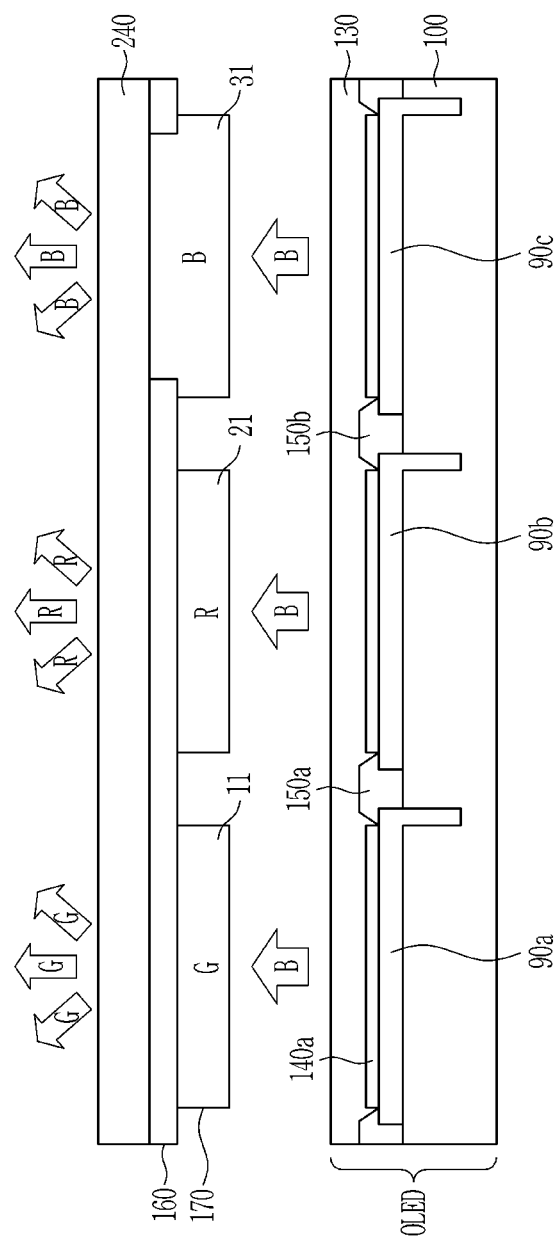
FIG. 3A is a schematic view showing a cross-section of a display device according to an embodiment.
Figure 3B:
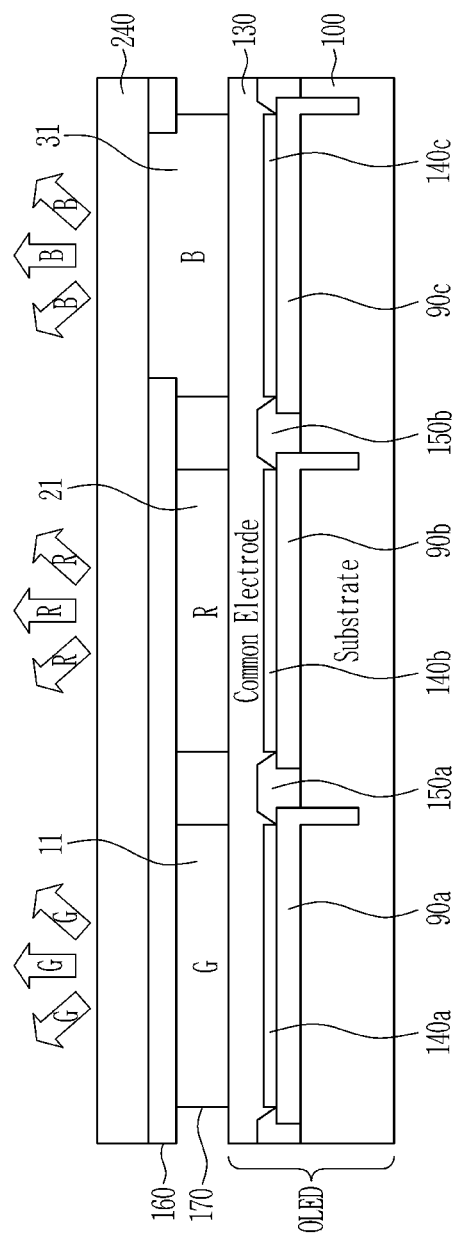
FIG. 3B is a schematic view showing a cross-section of a display device according to an embodiment.

FIG. 3A is a schematic cross-sectional view of a display device according to an embodiment, and FIG. 3B is a schematic cross-sectional view of a display device according to an embodiment. Referring to FIGS. 3A and 3B, a light source includes an organic light emitting diode (OLED) emitting blue light. The organic light emitting diode OLED may include (at least two, for example, three or more) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode (layer) 130 formed on the organic light emitting layer 140a, 140b, 140c. A thin film transistor and a substrate may be disposed under the organic light emitting diode (OLED).

A stacked structure including a quantum dot polymer composite pattern 170 (e.g., a section 31 including or not including a quantum dot e.g., emitting blue light, a section 21 including red light emitting quantum dots, and a section 11 including green light emitting quantum dots), optical filter layer 160, and a transparent substrate (or referred to as an upper substrate) 240 may be disposed on the light source. The excitation light (e.g., blue light) emitted from the light source and incident upon the patterned sections is converted to red and green light, respectively. Blue light emitted from the light source may pass through the third section of the patterned quantum dot polymer composite.

The display device may be obtained by separately producing the aforementioned stacked structure and (e.g., blue light emitting) LED or OLED and then assembling the same. The display device may be obtained by forming a quantum dot polymer composite pattern directly on the LED or OLED.

The substrate may be a substrate including an insulating material. The substrate may include glass; various polymers such as a polyester (e.g., polyethylene terephthalate (PET) or polyethylene naphthalate (PEN)), a polycarbonate, or a polyacrylate; a polysiloxane (e.g., polydimethylsiloxane (PDMS)); an inorganic material such as $Al_2O_3$ or ZnO; or a combination thereof, but is not limited thereto. A thickness of the substrate may be appropriately selected taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dots.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detailed structure of the wire layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode that will be described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) may be overlapped with a terminal end of the pixel electrode to divide the pixel electrode into a pixel unit. The pixel define layer may be an insulation layer which may electrically block the at least two pixel electrodes.

The pixel define layer may cover a portion of the upper surface of the pixel electrode, and the remaining region of the pixel electrode that is not covered by the pixel define layer may provide an opening. An organic emission layer that will be described herein may be formed on the region defined by the opening.

The organic emission layer defines each pixel area by the pixel electrode and the pixel define layer. In other words, one pixel area may be defined as an area formed with one organic emission unit layer which is contacted with one pixel electrode divided by the pixel define layer.

In a display device according to an embodiment, the organic emission layer may be defined as a first pixel area, a second pixel area and a third pixel area, and each pixel area is spaced apart from each other leaving a predetermined interval by the pixel define layer.

In an embodiment, the organic emission layer may emit a third light belong to visible light region or belong to an ultraviolet (UV) region. In other words, each of the first to the third pixel areas of the organic emission layer may emit a third light. In an embodiment, the third light may be a light having the highest energy in the visible light region, for example, may be blue light. When all pixel areas of the organic emission layer are configured to emit the same light, each pixel area of the organic emission layer may be formed of the same or similar materials or may show, e.g., exhibit, the same or similar properties. Thus a process difficulty of forming the organic emission layer may be reduced, e.g., relieved, and the display device may be applied for, e.g., used in, a large scale/large area process. However, the organic emission layer according to an embodiment is not necessarily limited thereto, but the organic emission layer may be configured to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device. The common electrode may be formed of a transparent conductive material such as indium tin oxide (ITO) or indium zinc oxide (IZO). The common electrode may be formed on the organic emission layer and may be integrated therewith.

A planarization layer or a passivation layer (not shown) may be formed on the common electrode. The planarization layer may include a (e.g., transparent) insulating material for ensuring electrical insulation with the common electrode.

In an embodiment, the display device may further include a lower substrate, a polarizer disposed under the lower substrate, and a liquid crystal layer disposed between the stack structure and the lower substrate, and in the stack structure, the light emission layer may be disposed to face the liquid crystal layer. The display device may further include a polarizer between the liquid crystal layer and the emission layer. The light source may further include LED and if desired, a light guide panel.

Figure 4:
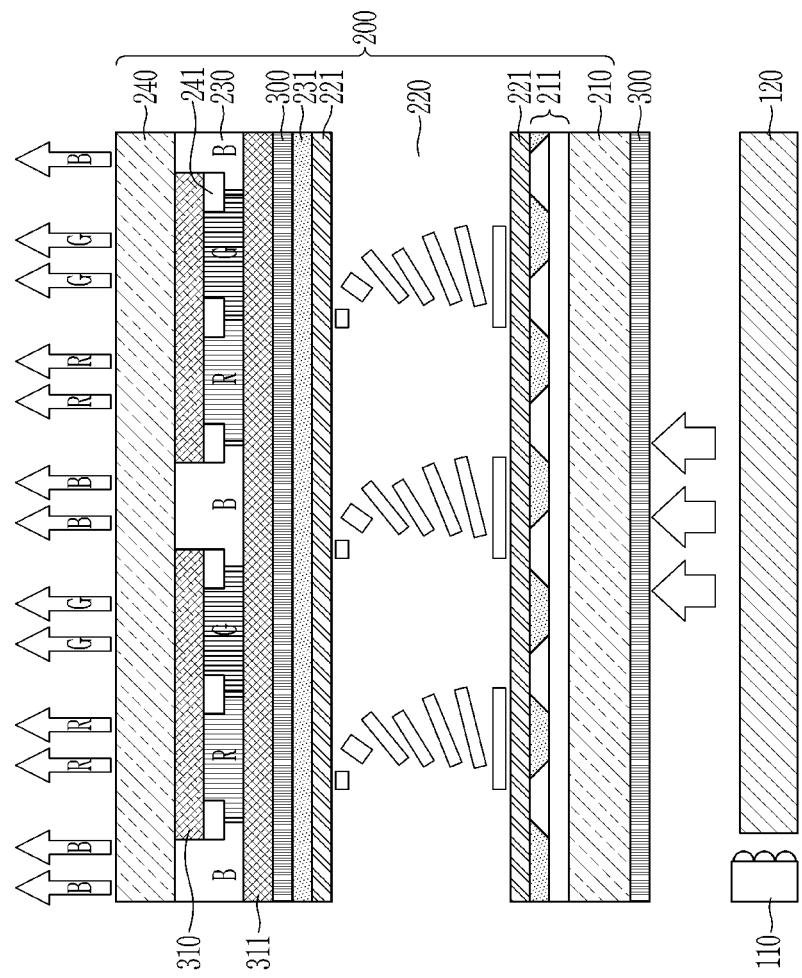
FIG. 4 is a schematic view showing a cross-section of a display device according to an embodiment.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizer 300 disposed under the liquid crystal panel 200, and a backlight unit (BLU) disposed under the polarizer 300.

The liquid crystal panel 200 includes a lower substrate 210, a stack structure, and a liquid crystal layer 220 disposed between the stack structure and the lower substrate. The stack structure includes a transparent substrate 240, a first optical filter layer 310, a photoluminescent layer 230 including a pattern of a quantum dot polymer composite, and a second optical filter layer 311.

The lower substrate 210 which is also referred to as an array substrate may be a transparent insulating material substrate. The substrate is the same as described herein. A wire plate 211 is provided on an upper surface of the lower substrate 210. The wire plate 211 may include a plurality of gate lines (not shown) and data lines (not shown) that define a pixel area, a thin film transistor disposed adjacent to a crossing region of gate lines and data lines, and a pixel electrode for each pixel area, but is not limited thereto. Details of such a wire plate are not particularly limited.

The liquid crystal layer 220 may be disposed on the wire plate 211. The liquid crystal panel 200 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal layer and the alignment layer are not particularly limited.

A lower polarizer 300 is provided under the lower substrate 210. Materials and structures of the polarizer 300 are not particularly limited. A backlight unit (e.g., emitting blue light) may be disposed under the polarizer 300.

An upper optical element or an upper polarizer 300 may be provided between the liquid crystal layer 220 and the transparent substrate 240, but is not limited thereto. For example, the upper polarizer may be disposed between the liquid crystal layer 220 and the light emission layer 230. The polarizer may be any suitable polarizer for use in a liquid crystal display device. The upper polarizer may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source 110 may emit blue light or white light. The light source 110 may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, an optical sheet (not shown) on the light guide panel, for example, a diffusion plate, a prism sheet, and the like, or a combination thereof, but is not limited thereto. In an embodiment, backlight unit does not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally an optical sheet. Details (e.g., each component of a light emitting diode, a fluorescent lamp, light guide panel, various optical sheets, and a reflector) of such a backlight unit are not particularly limited.

A black matrix (BM) 241 is provided on or under a bottom surface of the transparent substrate 240 and has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit a first light (e.g., red light), a second section (G) configured to emit a second light (e.g., green light), and a third section (B) configured to emit/transmit, for example blue light. If desired, the photoluminescent layer 230 may further include a fourth section. The fourth section may include a quantum dot that emits a light of different color from light emitted from the first to third sections (e.g., cyan, magenta, and yellow light).

In the light emission (photoluminescent) layer 230, sections forming a pattern may be repeated corresponding to pixel areas formed on the lower substrate 210. A transparent common electrode 231 may be provided on the photoluminescent layer (e.g., the photoluminescent color filter layer).

The third section (B) configured to emit/transmit blue light may be a transparent color filter that does not change a photoluminescence spectrum of the light source. In this case, blue light emitted from the backlight unit may enter in a polarized state and may be emitted through the lower polarizer and the liquid crystal layer as is. If desired, the third section may include a quantum dot emitting blue light.

If desired, the display device may further include a blue light blocking layer (e.g., blue cut filter) or a first optical filter layer. The blue light blocking layer or the first optical filter layer may be disposed between (bottom surfaces of)

the first section (R) and the second section (G) and the upper substrate 240 or on a top surface of the upper substrate 240. The blue light blocking layer or the first optical filter layer may include a sheet having openings that correspond to a pixel area showing a blue color (e.g., third section) and may be formed on portions corresponding to the first and second sections. As shown in FIG. 4, the first optical filter layer 310 may be integrally formed as one body structure at the remaining positions except positions overlapped with the third section, but is not limited thereto. At least two first optical filter layers may be spaced apart and be disposed on each of the positions overlapped with the first and the second sections.

In an embodiment, the first optical filter layer may block light having a portion of a wavelength region in the visible light region and transmit light having other wavelength regions. In an embodiment, the first optical filter layer may block blue light and transmit light except blue light. In an embodiment, the first optical filter layer may transmit green light, red light, and/or yellow light that is mixed light thereof.

In an embodiment, the first optical filter layer may substantially block blue light having a wavelength of less than or equal to about 500 nm and may transmit light in a visible light having a wavelength in a range of greater than about 500 nm and less than or equal to about 700 nm.

In an embodiment, the first optical filter layer may have light transmittance of greater than or equal to about 70%, greater than or equal to about 80%, greater than or equal to about 90%, or about 100% with respect to the visible light of greater than about 500 nm and less than or equal to about 700 nm. The first optical filter layer may include a polymer thin film including a dye, a pigment, or a combination thereof that absorbs light having a wavelength to be blocked. The first optical filter layer may block (e.g., absorb) greater than or equal to about 80%, greater than or equal to about 90%, or greater than or equal to about 95% of blue light having a wavelength of less than or equal to about 480 nm and may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) or substantially block blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may be disposed at a place overlapped with the section emitting green light and the second region may be disposed at a place overlapped with the section emitting red light. The first region and the second region may be optically isolated. The first optical filter (layer) may contribute to improving color purity of a display device.

The first optical filter layer may be a reflective filter including a plurality of layers (e.g., inorganic material layers) with different refractive index. For example, two layers having different refractive index may be alternately stacked with each other, or for example a layer having a high refractive index and a layer having a low refractive index may be alternately stacked with each other.

As the difference of the refractive index is between the layer having a high refractive index and the layer having a low refractive index increases, the first optical filter layer thus formed may have a higher, e.g., greater, wavelength selectivity. A thickness and the stacked number of the layer having a high refractive index and the layer having a low refractive index may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different from each other.

The display device may further include a second optical filter layer (e.g., red/green light or yellow light recycling layer) disposed between the light emission layer and the liquid crystal layer (e.g., between light emission layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking a material having a high refractive index and a material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof. According to an embodiment, the layer having a high refractive index in the second optical filter layer may include a variety of materials having a higher refractive index than the layer having a low refractive index.

The layer having a low refractive index in the second optical filter layer may include, for example, a silicon oxide. According to an embodiment, the layer having a low refractive index in the second optical filter layer may include a variety of materials having a lower refractive index than the layer having a high refractive index.

As the refractive index difference between the layer having a high refractive index and the layer having a low refractive index increases, the second optical filter layer may have a higher, e.g., greater, wavelength selectivity.

In the second optical filter layer, each thickness of the layer having a high refractive index and the layer having a low refractive index and the stacked number thereof may be determined depending upon a refractive index of each layer and the reflected wavelength. For example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer may transmit only the third light (B) in a blue light wavelength region of less than or equal to about 500 nm and light in a wavelength region of greater than about 500 nm, that is, green light (G), yellow light, red light (R), and the like may not pass through the second optical filter layer 311 and may not be reflected. Thus the reflected green light and red light may pass through the first and the second sections to be emitted to the outside of the display device.

The second optical filter layer may reflect a light of a wavelength region of greater than about 500 nm in greater than or equal to about 70%, greater than or equal to about 80%, greater than or equal to about 90%, or about 100%.

Meanwhile, the second optical filter layer may have a transmittance to light of a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

In an embodiment, the stack structure may be produced by a method using the photoresist composition. The method may include:

forming a film of the composition on a substrate;
exposing a selected region of the film to light (e.g., a wavelength of less than or equal to about 400 nm); and
developing the exposed film with an alkali developing solution to obtain a pattern including the quantum dot-polymer composite.

Figure 5A:
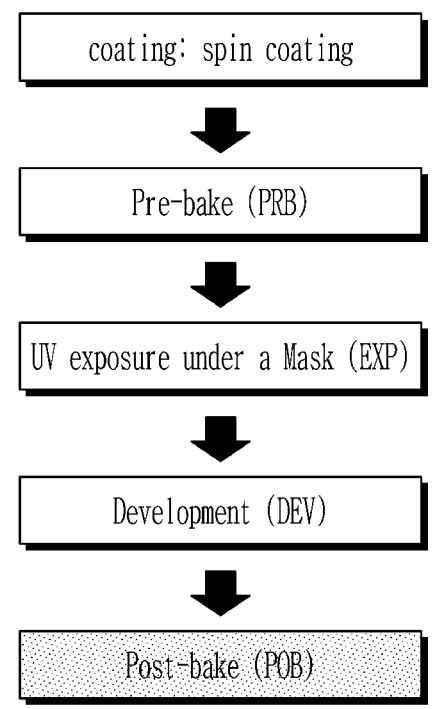
FIG. 5A schematically shows a pattern forming process using a composition according to an embodiment.
Figure 5A:
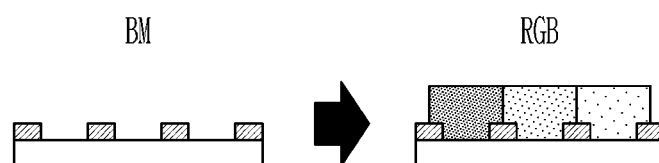

The substrate and the composition are the same as described herein. Non-limiting methods of forming the pattern are illustrated, referring to FIG. 5A.

The composition is coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film is exposed to light having a predetermined wavelength under a mask having a predetermined pattern (S3). A wavelength and intensity of the light may be selected by taking into consideration the initiator (e.g., photoinitiator), an amount of the initiator (e.g., photoinitiator), the quantum dots, amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green light emitting quantum dot, or optionally, a blue light emitting quantum dot) and an appropriate number of times (e.g., two or more times or three or more times) repeating a formation of the pattern about each composition (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

Figure 5B:
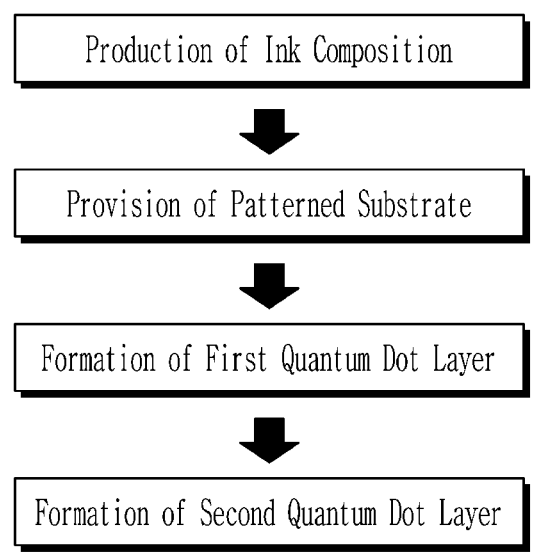
FIG. 5B schematically shows a pattern forming process using a composition according to an embodiment.

A quantum dot composite pattern may be formed by using an ink composition configured to form a pattern via an ink jet manner. Referring to FIG. 5B, the method includes preparing an ink composition; obtaining a substrate including a pattern of, for example, an electrode and optionally a pixel area formed by a bank; depositing an ink composition on the substrate (or the pixel area) to form a first quantum dot layer (or a first repeating section); and depositing an ink composition on the substrate (or the pixel area) to form a second quantum dot layer (or a second repeating section). Formation of the first quantum dot layer and the second quantum dot layer may be carried out simultaneously or sequentially.

Deposition of the ink composition may be carried out using an appropriate droplet discharging system such as an ink jet printer or a nozzle printing system (e.g., having an ink reservoir and a, e.g., at least one, printer head).

The deposited ink composition may be heated to remove a solvent and optionally to carry out a polymerization, and thus, provide a (first or second) quantum dot layer. The method may provide a highly precise quantum dot-polymer composite film or pattern in a simple way for a short time.

An embodiment provides an electronic device including the quantum dot. The electronic device may include a light emitting diode (LED), an organic light emitting diode (OLED), a sensor, a solar cell, an imaging sensor, or a liquid crystal display (LCD), but is not limited thereto.

The quantum dots of the embodiment may be included in an electronic apparatus. The electronic apparatus may include a handheld terminal, a monitor, a notebook computer, a television, an electronic display board, a camera, an automatic vehicle, but is not limited thereto. The electronic apparatus may be a handheld terminal, a monitor, a notebook computer, or a television each of which includes a display device (or a light emitting device) including a quantum dot. The electronic apparatus may be a camera or a handheld terminal each of which includes an image sensor including a quantum dot. The electronic apparatus may be a camera or an automatic vehicle each of which includes a photodetector including the core shell quantum dots.

Figure 6:
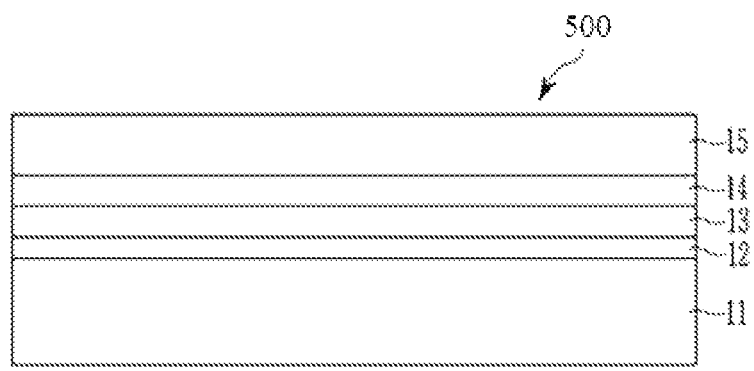
FIG. 6 is a schematic cross-sectional view of a light emitting device according to an embodiment.

Referring to FIG. 6, the electronic device 500 may include a first electrode 11 and a second electrode 15 each having a surface opposite the other and an active layer 13 disposed between the first and the second electrodes and including the aforementioned quantum dot composite. The first electrode 11 or the second electrode 15 may be an anode and the other may be a cathode. In particular, the first electrode 11 is an anode and the second electrode 15 is a cathode as discussed further herein.

In an embodiment, the electronic device may be an electroluminescent device. The active layer 13 may be an light emissive layer that includes the core shell quantum dots, and in which an electron and a hole injected from cathode 15 and anode 11, respectively, are recombined to form an exciton and according to the energy of the formed exciton, light having a predetermined wavelength is emitted. In an embodiment, the electronic device including the quantum dot may be a photodetector or a solar cell. The active layer 13 may be a light absorptive layer and the core shell quantum dot of the active layer 13 may absorb a photon from outside, which will then be separated into a hole and an electron and provide the same with the anode 11 and the cathode 15, respectively.

In an embodiment, the electronic device may include a hole auxiliary layer 12 between the first electrode (anode) 11 and the active layer 13 and/or an electron auxiliary layer 14 between the second electrode (cathode) 15 and the active layer 13.

The electronic device may further include a substrate (not shown). The substrate may be disposed at the side of the anode 11 or the cathode 15, or at the sides of both electrodes. In an embodiment, the substrate may be disposed at an opposite surface of the first electrode (anode). The substrate may include an insulating material (e.g., insulating transparent substrate).

The substrate may include glass; a polymer such as a polyester (e.g., polyethylene terephthalate (PET), polyethylene naphthalate (PEN)), a polycarbonate, a polyacrylate, a polyimide, a poly(amide-imide), a polysiloxane (e.g., polydimethylsiloxane (PDMS)), or a combination thereof; an inorganic material such as $Al_2O_3$, ZnO, or a combination thereof; or a combination comprising a least two of the foregoing, but is not limited thereto. The substrate may be made of a silicon wafer. As used herein, the term "transparent" refers to having a transmittance of greater than or equal to about 85% of light having a predetermined wavelength (e.g., light emitted from a quantum dot), or for example, transmittance of greater than or equal to about 88%, greater than or equal to about 90%, greater than or equal to about 95%, greater than or equal to about 97%, or greater than or equal to about 99%, e.g., about 85% to about 99.99%, or about 90% to about 99.9%. A thickness of the substrate may be appropriately selected taking into consideration a substrate material but is not particularly limited. The transparent substrate may be flexible.

The first electrode 11 may be made of an electrically conductive material, for example a metal, a conductive metal oxide, or a combination thereof. The first electrode 11 may include, for example, a metal or an alloy thereof, the metal including nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and a metal oxide such as ZnO and Al or $SnO_2$ and Sb, but is not limited thereto.

The second electrode 15 may be made of a conductive material, for example a metal, a conductive metal oxide, a conductive polymer, or a combination thereof. The second electrode 15 may include, for example, a metal or an alloy thereof, such as aluminum, magnesium, calcium, sodium, potassium, titanium, indium, yttrium, lithium, gadolinium, silver, gold, platinum, tin, lead, cesium, or barium; a multilayer structured material such as LiF/Al, $Li_2O$/Al, 8-hydroxyquinolinolato-lithium/aluminum (Liq/Al), LiF/Ca, or $BaF_2$/Ca, but is not limited thereto. A combination comprising at least two of the foregoing may also be used. The conductive metal oxide is the same as described herein.

In an embodiment, a work function of the first electrode 11 and a work function of the second electrode 15 are not particularly limited and selected appropriately. A work function of the first electrode may be higher than or lower than a work function of the second electrode.

At least one of the first electrode 11 and the second electrode 15 may be a light-transmitting electrode and the light-transmitting electrode may be for example made of a conductive oxide such as a zinc oxide, an indium oxide, a tin oxide, an indium tin oxide (ITO), an indium zinc oxide (IZO), a fluorine doped tin oxide, a metal thin layer including a single layer or a multilayer, or a combination thereof. When one of the first electrode 11 and the second electrode 15 is a non-light-transmitting (e.g., non-transparent) electrode, the non-light-transmitting electrode may include, for example, an opaque conductive material such as aluminum (Al), silver (Ag), gold (Au), or a combination thereof.

A thickness of the electrodes (the first electrode and/or the second electrode) is not particularly limited and may be appropriately selected taking into consideration the device efficiency. For example, the thickness of the electrodes may be greater than or equal to about 5 nanometers (nm), for example, greater than or equal to about 50 nm, or greater than or equal to about 1 µm. For example, the thickness of the electrodes may be less than or equal to about 100 micrometers (µm), for example, less than or equal to about 10 µm, less than or equal to about 1 µm, less than or equal to about 900 nm, less than or equal to about 500 nm, or less than or equal to about 100 nm.

The active layer 13 includes (e.g., a plurality of) the aforementioned quantum dot(s). The active layer may include at least one monolayer of the quantum dots. The active layer 13 may include at least one monolayer (e.g., at least two monolayers, at least three monolayers, at least four monolayers) of the quantum dot. The number of the monolayers of the quantum dots may be less than or equal to about 20, less than or equal to about 10, less than or equal to about 9, less than or equal to about 8, less than or equal to about 7, or less than or equal to about 6.

The active layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The active layer 13 may have for example a thickness of about 10 nm to about 150 nm, for example about 20 nm to about 100 nm or about 30 nm to about 50 nm.

The electronic device of an embodiment may further include a hole auxiliary layer 12. In a non-limiting embodiment, the hole auxiliary layer 12 may be disposed between the first electrode 11 and the active layer 13. The hole auxiliary layer 12 may have one layer or two or more layers, and may include, for example, a hole injection layer (HIL), a hole transport layer (HTL), an electron blocking layer, or a combination thereof. The hole auxiliary layer 12 may include a single component layer or a multi-layered structure wherein adjacent layers include different components from each other.

The hole auxiliary layer 12 may have a highest occupied molecular orbital (HOMO) energy level that may match a HOMO energy level of the active layer 13 in order to facilitate mobility of holes from the hole auxiliary layer 12 into the active layer 13. In an embodiment, the hole auxiliary layer 12 may include a hole injection layer proximate to the first electrode 11 and a hole transport layer proximate to the active layer 13.

A material included in the hole auxiliary layer 12 (for example, a hole transporting layer or a hole injection layer) is not particularly limited and may include, for example, poly(9,9-dioctyl-fluorene-co-N-(4-butylphenyl)-diphenylamine) (TFB), polyarylamine, poly(N-vinylcarbazole), poly(3,4-ethylenedioxythiophene) (PEDOT), poly(3,4-ethylenedioxythiophene): polystyrene sulfonate (PEDOT:PSS), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), 4,4',4"-tris[phenyl(m-tolyl)amino]triphenylamine (m-MTDATA), 4,4',4"-tris(N-carbazolyl)-triphenylamine (TCTA), 1,1-bis[(di-4-tolylamino)phenylcyclohexane (TAPC), a p-type metal oxide (e.g., NiO, $WO_3$, $MoO_3$, etc.), a carbon-based material such as graphene oxide, or a combination thereof, but is not limited thereto.

If used, the electron blocking layer (EBL) may include, for example, poly(3,4-ethylenedioxythiophene):poly(styrene sulfonate) (PEDOT:PSS), poly(9,9-dioctyl-fluorene-co-N-(4-butylphenyl)-diphenylamine) (TFB), polyarylamine, poly(N-vinylcarbazole), polyaniline, polypyrrole, N,N,N',N'-tetrakis(4-methoxyphenyl)-benzidine (TPD), 4,4'-bis[N-(1-naphthyl)-N-phenyl-amino]biphenyl (α-NPD), m-MTDATA, 4,4',4"-tris(N-carbazolyl)-triphenylamine (TCTA), or a combination thereof, but is not limited thereto.

In the hole auxiliary layer(s), a thickness of each layer may be appropriately selected depending on the desired characteristics of each layer. For example, the thickness of each layer may be greater than or equal to about 5 nm, greater than or equal to about 10 nm, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

In an embodiment, the electron auxiliary layer 14 may be disposed between the active layer 13 and the second electrode 15. The electron auxiliary layer 14 may include, for example, an electron injection layer (EIL) facilitating the injection of the electrons, an electron transport layer (ETL) facilitating the transport of the electrons, a hole blocking layer (HBL) blocking the hole movement, or a combination thereof, but is not limited thereto. In an embodiment, the EIL may be disposed between the ETL and the cathode. In an embodiment, the HBL may be disposed between the ETL (or the EIL) and the emissive layer, but is not limited thereto. In an embodiment, a thickness of each layer may be selected appropriately and may be greater than or equal to about 1 nm and less than or equal to about 500 nm, but is not limited thereto. The EIL may be an organic layer (e.g., prepared by vapor deposition). The ETL may include an inorganic oxide nanoparticle, an organic layer (e.g., prepared by vapor deposition), or a combination thereof.

The electron transport layer, the electron injection layer, or a combination thereof may include, for example, 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato) aluminum ($Alq_3$), tris(8-hydroxyquinolinato) gallium ($Gaq_3$), tris(8-hydroxyquinolinato) indium ($Inq_3$), bis(8-hydroxyquinolinato) zinc ($Znq_2$), bis(2-(2-hydroxyphenyl)benzothiazolate) zinc ($Zn(BTZ)_2$), bis(10-hydroxybenzo[h]quinolinato) beryllium ($BeBq_2$), 8-(4-(4,6-di(naphthalen-2-yl)-1,3,5-triazin-2-yl)phenyl)quinolone (ET204), 8-hydroxyquinolinato lithium (Liq), an n-type metal oxide (e.g., ZnO, $HfO_2$, etc.), or a combination thereof, but is not limited thereto.

In an embodiment, the electron auxiliary layer 14 may include an electron transport layer. The ETL may include a plurality of nanoparticles. The nanoparticles include a metal oxide including zinc. The metal oxide may include zinc oxide, zinc magnesium oxide, or a combination thereof. The metal oxide may include $Zn_{1-x}M_xO$ (wherein M is Mg, Ca, Zr, W, Li, Ti, Y, Al, or a combination thereof and $0 \le x \le 0.5$). In an embodiment, the M may be magnesium (Mg). In an embodiment, x may be greater than or equal to about 0.01 and less than or equal to about 0.3, for example, less than or equal to about 0.25, less than or equal to about 0.2, or less than or equal to about 0.15. An absolute value of lowest unoccupied molecular orbital (LUMO) of quantum dots included in the emission layer may be smaller than an absolute value of LUMO of the metal oxide. In an embodiment, an absolute value of LUMO of quantum dots may be larger than an absolute value of LUMO of a metal oxide of ETL. An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm.

The hole blocking layer (HBL) may include, for example, 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, or a combination thereof, but is not limited thereto.

In an embodiment, the thickness of the electron auxiliary layer 14 (e.g., the thickness of each of an electron injection layer, an electron transport layer, or a hole blocking layer)

may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 7:
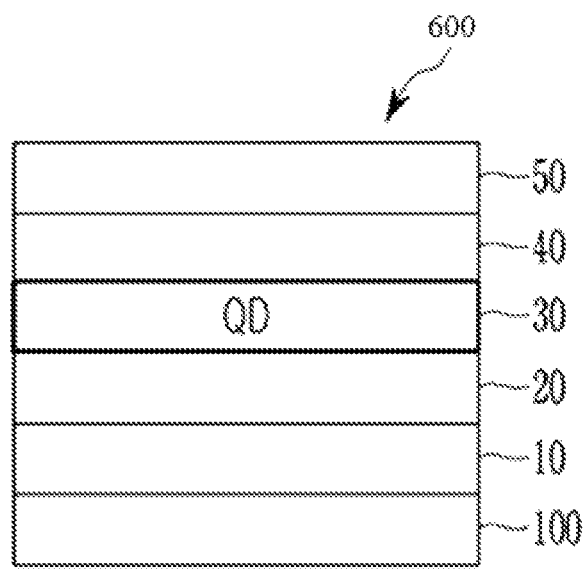
FIG. 7 is a schematic cross-sectional view of a light emitting device according to an embodiment.

Referring to FIG. 7, an electroluminescent device of an embodiment may have a normal structure. The electroluminescent device 600 may include a transparent substrate 100, an anode 10 disposed on the transparent substrate 100 and a cathode 50 facing the anode 10. The anode 10 may include a metal oxide-based transparent electrode and a cathode 50 facing the anode may include a metal of a relatively low work function. For example, the anode may be an electrode including indium tin oxide (ITO, a work function of about 4.6 eV and about 5.1 eV) and the cathode may be an electrode including magnesium (Mg, a work function of about 3.66 eV), aluminum (Al, a work function of about 4.28 eV) or a combination thereof. In an embodiment, a hole auxiliary layer 20 may be disposed between the anode 10 and the quantum dot active layer 30. The hole auxiliary layer 20 may include a hole transporting layer, a hole injecting layer, or a combination thereof. If present, the hole injecting layer may be disposed proximate to the anode 10 and the hole transporting layer may be disposed proximate to the quantum dot active layer. In an embodiment, an electron auxiliary layer 40 may be disposed between the quantum dot active layer 30 and the cathode 50. The electron auxiliary layer 40 may include an electron injection layer and/or an electron transporting layer. The electron injection layer may be disposed proximate to the cathode 50 and the electron transporting layer may be disposed proximate to the quantum dot active layer 30.

Figure 8:
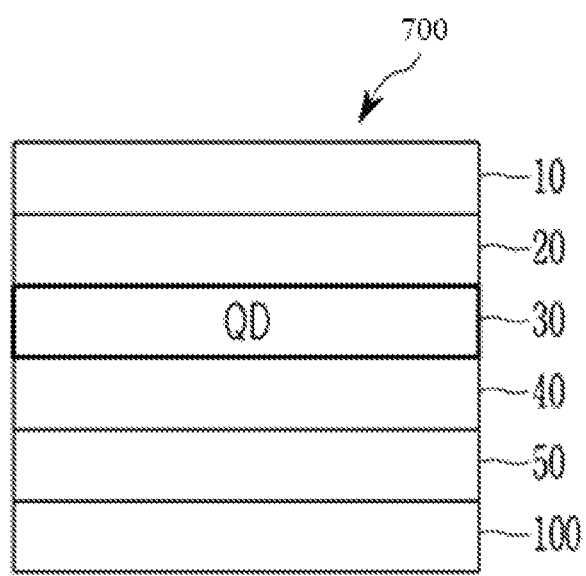
FIG. 8 is a schematic cross-sectional view of a light emitting device according to an embodiment.

Referring to FIG. 8, a device 700 according to an embodiment may have an inverted structure. An electroluminescent device having the inverted structure may include a cathode 50 disposed on a transparent substrate 100 and an anode 10 facing the cathode. The cathode 50 may include a metal oxide-based transparent electrode (e.g., ITO) and the anode facing the same may include a metal of a relatively high work function. In an embodiment, the anode 50 may be an electrode including indium tin oxide (ITO, a work function of about 4.6 eV and about 5.1 eV) and the cathode may be an electrode including gold (Au, a work function of about 5.1 eV), silver (Ag, a work function of about 4.26 eV), aluminum (Al, a work function of about 4.28 eV), or a combination thereof.

In an embodiment, an electron auxiliary layer 40 may be disposed between the cathode 50 and the quantum dot active layer 30. The electron auxiliary layer 40 may include an electron transporting layer, an electron injecting layer, or a combination thereof. If present, the electron injecting layer may be disposed proximate to the cathode 50 and the electron transporting layer may be disposed proximate to the quantum dot active layer 30. In an embodiment, an electron auxiliary layer 40 may be disposed between the quantum dot active layer 30 and the cathode 50. The electron auxiliary layer 40 (e.g., the electron transporting layer) may include a metal oxide such as a crystalline Zn oxide or n-type doped metal oxide. A hole auxiliary layer 20 may be disposed between the anode 10 and the quantum dot active layer 30. The hole auxiliary layer 20 may include a hole transporting layer, a hole injecting layer, or a combination thereof. If present, the hole injecting layer may be disposed proximate to the anode 10 and the hole transporting layer may be disposed proximate to the quantum dot active layer. The hole transport layer (HTL) may include TFB, PVK, or a combination thereof, and the hole injection layer (HIL) may include $MoO_3$ or another p-type metal oxide, or a combination thereof.

The electroluminescent device may emit light of a predetermined wavelength generated in the active layer 30 through a transparent electrode and a transparent substrate. For example, referring to FIG. 5B, the anode 10 include a transparent electrode based on indium tin oxide (ITO), the light generated in the active layer may pass the anode 10 and the transparent substrate 100 and emit out of the device. Referring to FIG. 5C, the cathode 50 include a transparent electrode based on indium tin oxide (ITO), the light generated in the active layer may pass the cathode 50 and the transparent substrate 100 and emit out of the device.

The device of the embodiment may be prepared in an appropriate manner. In an embodiment, the electroluminescent device may be prepared by forming a charge (e.g., hole or electron) auxiliary layer on a substrate having an electrode thereon, forming an active layer including the quantum dots (e.g., a pattern of the aforementioned quantum dots) thereon, and forming an electrode (optionally together with a charge (e.g., electron or hole) auxiliary layer) thereon. The formation of the electrode/hole auxiliary layer/electron auxiliary layer is not particularly limited and the electrode, the hole auxiliary layer, and the electron auxiliary layer may be each independently formed in an appropriate manner (e.g., via a physical or chemical deposition or a coating).

Hereinafter, the embodiments are illustrated in more detail with reference to examples. However, they are exemplary embodiments of the present invention, and the present invention is not limited thereto.

EXAMPLES

Analysis Methods
1. Ultraviolet-Visible (UV-Vis) Absorption Spectroscopy
    A UV-Vis absorption spectroscopy is performed, and a UV-Visible absorption spectrum is obtained by using an Agilent Cary 5000 spectrophotometer.
2. Photoluminescence Analysis
    A photoluminescence (PL) spectrum of a produced quantum dot at an excitation wavelength of 450 nanometers (nm) is obtained using a Hitachi F-7000 spectrophotometer.
3. Inductively Coupled Plasma-Atomic Emission Spectroscopy (ICP-AES)
    An inductively coupled plasma-atomic emission spectroscopy (ICP-AES) is performed using Shimadzu ICPS-8100.
4. Blue Light Absorption Rate and Light Conversion Efficiency (CE) of Composite
    An integral hemisphere is used to measure a light dose (B) of blue excitation light. Then, a quantum dot polymer composite is put in the integral hemisphere and irradiated by the blue excitation light to measure a green light dose (A) and a blue light dose (B') irradiating out from the composite.

A blue light absorption and a light conversion efficiency are calculated according to the following equations.

Blue light absorption rate (%)=((B−B')/B)×100(%)

Light conversion efficiency (%, CE)=(A/(B−B'))×100 (%)

Example 1

Seed Synthesis:

Selenium is dispersed in trioctylphosphine (TOP) to obtain a Se/TOP stock solution. In a 300 milliliter (mL) reaction flask containing trioctylamine, an organic ligand including oleic acid is put and then, heated at 120° C. under vacuum. After about 1 hour, an atmosphere in the reactor is converted into inert gas. While the temperature of the reactor is increased up to 300° C., diethylzinc, diphenylphosphine oxide, and the Se/TOP stock solution are injected thereinto. After completing the injection, a reaction is performed for 40 minutes.

When the reaction is complete, acetone is added to the reaction solution, which is rapidly cooled down to room temperature, and a precipitate obtained by centrifuging the mixture is dispersed in toluene to obtain a ZnSe seed. The ZnSe seed has an average size of about 2.5 nm.

Amounts of the Zn precursor and the Se precursor used herein are 0.9 millimoles (mmol), and 0.45 mmol, respectively.

Formation of Quantum Well Layer Including an Alloy Semiconductor Nanocrystal:

An organic ligand including oleic acid is placed in a 300 mL reaction flask containing octadecene (ODE) and vacuum-treated at 120° C. The atmosphere in the flask is changed into nitrogen ($N_2$). While the temperature of the reactor is increased to 300° C., toluene dispersion of the ZnSe seed is rapidly put in the reaction flask, and subsequently, indium laurate, tris(trimethylsilyl)phosphine (hereinafter, also referred to as 'TMSP'), and a trioctyl phosphine dispersion of gallium chloride are injected thereto. Then, a reaction is performed for 30 minutes to form a quantum well layer on the seed.

When the reaction is complete, the reaction solution is rapidly cooled down to room temperature and ethanol is added thereto, and a precipitate is separated by centrifuging and is dispersed in toluene.

A used amount of the indium precursor is about 0.5 moles per one mole of selenium. A mole ratio among the indium, the phosphorus, and the gallium is about 1:1:0.4.

For the particle thus prepared, an ICP analysis is made and the results are summarized in Table 1. A transmission electron microscopy analysis is made for the prepared particle and the results confirm that the particle size having the formed quantum well layer is about 3.15 nm.

Example 2

A particle having the quantum well layer on the seed is prepared in the same manner as in Example 1 except for increasing the amount of the gallium by two times. For the particle thus prepared, an ICP analysis is made and the results are summarized in Table 1.

Comparative Example 1

A particle having the quantum well layer on the seed is prepared in the same manner as in Example 1 except for not using the gallium precursor. For the particle thus prepared, an ICP analysis is made and the results are summarized in Table 1. A transmission electron microscopy analysis is made for the prepared particle and the results confirm that the thickness of the quantum well layer as formed is about 3.01 nm.

Thus, the particle prepared in Example 1 has a volume increased by 15% in comparison with the particle prepared in Comparative Example 1.

Comparative Example 2

A particle having the quantum well layer on the seed is prepared in the same manner as in Example 1 except for increasing the amount of the gallium by two times. For the particle thus prepared, an ICP analysis is made and the results are summarized in Table 1.

TABLE 1

| | PL | | | | |
| --- | --- | --- | --- | --- | --- |
| | Emission layer | PL wavelength and stokes shift (nm) | ICP (mole ratio) | | |
| | | | P:Se | In:Se | Ga:Se |
| Example 1 | InGaP | 512 and 152 | 0.48:1 | 0.50:1 | 0.08:1 |
| Example 2 | | 500 and 152 | 0.49:1 | 0.48:1 | 0.18:1 |
| Comp. Example 1 | InP | 536 and 176 | 0.64:1 | 0.68:1 | — |
| Comp. Example 2 | | 512 and 152 | 0.61:1 | 0.82:1 | — |

The results of Table 1 confirm that the introduction of the gallium into the emission layer may suppress the stokes shift and the PL wavelength may decrease.

Formation of the Shell Layer and Preparation of Quantum Dot Composite

Example 3

1. Zinc acetate and oleic acid are placed in a 300 mL reaction flask containing TOA and then, vacuum-treated at 120° C. The flask is internally substituted with nitrogen ($N_2$). While the reaction temperature of the reactor is increased to 320° C., toluene dispersion of the particles having the quantum well layer injected to the reaction flask, then the Se/TOP stock solution are injected thereto, and subsequently, a S/TOP stock solution together with zinc acetate is injected thereto, as well. A reaction is performed for predetermined time, and a ZnSe/ZnS shell layer is formed on the quantum well layer.

An amount, e.g., mole, ratio between a Zn precursor and an Se precursor is about 1:2:1 and an amount, e.g., mole, ratio of the Zn precursor used for the synthesis of the seed: the Zn precursor used for the formation of the shell is about 1:3:1.

When the reaction is complete, ethanol is added to the reaction solution, which is rapidly cooled down to room temperature, and a precipitate obtained by centrifuging the mixture is dispersed in toluene to obtain toluene dispersion of QW quantum dots.

Figure 9:
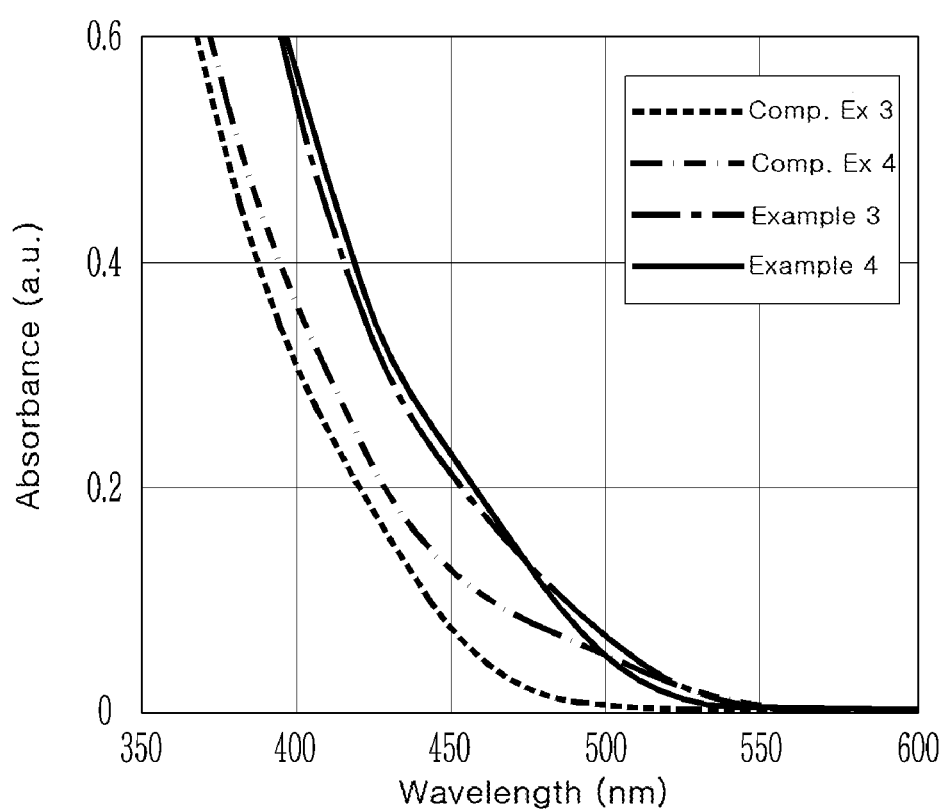
FIG. 9 is a graph of Absorbance (arbitrary units (a.u.)) versus Wavelength (nm) showing the result of UV-Vis spectroscopy of the quantum dots prepared in Example 3, Example 4, Comparative Example 3, and Comparative Example 4.

An UV-Vis absorption spectroscopy analysis is performed for the prepared QW quantum dots, and the results are shown in FIG. 9.

A photoluminescent spectroscopy analysis is performed for the prepared QW quantum dots, and the results are shown in table 2. For the QW quantum dots thus prepared, an ICP analysis is made and the results are summarized in Table 2.

2. Production of a Quantum Dot Polymer Composite and a Pattern Thereof (1) Preparation of Quantum Dot-Binder Dispersion A chloroform solution of the prepared quantum dots is mixed with a solution of a binder polymer, which is a four membered copolymer of methacrylic acid, benzyl methacrylate, hydroxyethyl methacrylate, and styrene, (acid value: 130 milligrams (mg) of KOH per gram (mg KOH/g), molecular weight: 8,000 grams per mole (g/mol), methacrylic acid:benzyl methacrylate:hydroxyethyl methacrylate:styrene (mole ratio)=61.5:12:16.3:10.2) (solvent: propylene glycol monomethyl ether acetate, PGMEA, a concentration of 30 percent by weight (wt %)) to form a quantum dot-binder dispersion.

(2) Preparation of a Photosensitive Composition

To the prepared quantum dot-binder dispersion, a hexaacrylate having the following structure (as a photopolymerizable monomer), ethylene glycol di-3-mercaptopropionate (hereinafter, 2T, as a multi-thiol compound), an oxime ester compound (as an initiator), $TiO_2$ as a metal oxide fine particle, and PGMEA (as a solvent) are added to obtain a composition.

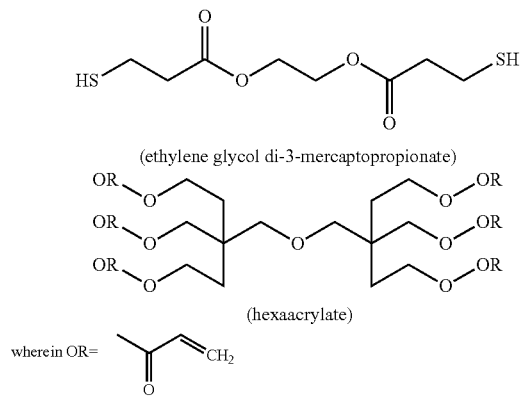

Based on a total solid content, the prepared composition includes 40 wt % of quantum dots, 12.5 wt % of the binder polymer, 25 wt % of 2T, 12 wt % of the photopolymerizable monomer, 0.5 wt % of the photoinitiator, and 10 wt % of the metal oxide fine particle. The total solid content is about 25 wt %.

(3) Formation of Quantum Dot-Polymer Composite Pattern and Heat Treatment Thereof The obtained composition is spin-coated on a glass substrate at 150 revolutions per minute (rpm) for 5 seconds to provide a film. The obtained film is pre-baked at 100° C. (PRB). The pre-baked film is exposed to light (wavelength: 365 nanometers (nm), intensity: 100 millijoules (mJ)) under a mask having a predetermined pattern (e.g., a square dot or stripe pattern) for 1 second (EXP) and developed with a potassium hydroxide aqueous solution (concentration: 0.043 wt %) for 50 seconds to obtain a pattern of a quantum dot polymer composite.

The obtained pattern is heat-treated at a temperature of 180° C. for 30 minutes under a nitrogen atmosphere (FOB).

For the obtained pattern film, a blue light absorption rate and a photoconversion efficiency are measured and the results are shown in Table 2.

The QW quantum dots of Example 1 have a narrower FWHM than those of Comparative Example 1, and the results of Table 1 show that the QW quantum dots of Example 1 have improved absorption and enhanced luminance efficiency.

Example 4

A QW quantum dot is prepared in the same manner as in Example 3 except for using the particle prepared in Example 2. For the particle thus prepared, an ICP analysis is made and the results are summarized in Table 1.

A photoluminescent spectroscopy analysis is performed for the prepared QW quantum dots, and the results are shown in table 2. For the QW quantum dots thus prepared, an ICP analysis is made and the results are summarized in Table 2.

An UV-Vis absorption spectroscopy analysis is performed for the prepared QW quantum dots, and the results are shown in FIG. 9. The results confirms that the UV-Vis absorption curve has no inflection point and does not include the first absorption peak.

A quantum dot polymer composite pattern is prepared in the same manner as in Example 2 except for using the prepared QW quantum dot. For the obtained pattern film, a light absorption rate and a light conversion efficiency are measured and the results are shown in Table 2.

Comparative Example 3

A QW quantum dot is prepared in the same manner as in Example 3 except for using the particle prepared in Comparative Example 1. For the particle thus prepared, an ICP analysis is made and the results are summarized in Table 1.

A photoluminescent spectroscopy analysis is performed for the prepared QW quantum dots, and the results are shown in table 2. For the QW quantum dots thus prepared, an ICP analysis is made and the results are summarized in Table 2.

An UV-Vis absorption spectroscopy analysis is performed for the prepared QW quantum dots, and the results are shown in FIG. 9. The results confirm that the quantum dot as prepared has significantly low absorption for light at 450 nm in comparison with Example 3 and Example 4.

A quantum dot polymer composite pattern is prepared in the same manner as in Example 2 except for using the prepared QW quantum dot. For the obtained pattern film, a light absorption rate and a light conversion efficiency are measured and the results are shown in Table 2.

Comparative Example 4

A QW quantum dot is prepared in the same manner as in Example 3 except for using the particle prepared in Comparative Example 2. For the particle thus prepared, an ICP analysis is made and the results are summarized in Table 1.

A photoluminescent spectroscopy analysis is performed for the prepared QW quantum dots, and the results are shown in table 2. For the QW quantum dots thus prepared, an ICP analysis is made and the results are summarized in Table 2.

An UV-Vis absorption spectroscopy analysis is performed for the prepared QW quantum dots, and the results are shown in FIG. 9. The results confirm that the quantum dot as prepared has significantly low absorption for light at 450 nm in comparison with Example 3 and Example 4.

A quantum dot polymer composite pattern is prepared in the same manner as in Example 2 except for using the prepared QW quantum dot. For the obtained pattern film, a light absorption rate and a light conversion efficiency are measured and the results are shown in Table 2.

TABLE 2

| | PL wavelength (nm) | Relative Quantum Yield (QY) | Absorption rate | Conversion efficiency | ICP (mole ratio) | | | | |
|---|---|---|---|---|---|---|---|---|---|
| | | | | | P:In | S:In | Zn:In | Se:In | Ga:In |
| Example 3 | 545 | 106% | 92.1% | 19.5% | 0.73:1 | 6.86:1 | 24.32:1 | 12.32:1 | 0.18:1 |
| Example 4 | 535 | 120% | 94.5% | 16.5% | 0.81:1 | 7.24:1 | 25.10:1 | 13.29:1 | 0.14:1 |
| Comp. Example 3 | 549 | 100% | 90% | 18.7% | 0.78:1 | 7.4:1 | 22.5:1 | 11.78:1 | 0.00:1 |
| Comp. Example 4 | 512 | 44% | 89% | 5.2% | 0.69:1 | 13.08:1 | 40.77:1 | 21.38:1 | 0.00:1 |

The results of Table 2 show that the QW quantum dots of Examples may suppress the red shift phenomenon and the quantum dot composite of the examples may exhibit improved absorption and enhanced luminance efficiency in comparison with the QW quantum dots and the quantum dot composite of Comparative Examples.

The quantum dots of the embodiment may exhibit a structure of a quantum well structure and may show improved conversion rate at a relatively short wavelength.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising
a seed comprising a first semiconductor nanocrystal,
a quantum well layer disposed on the seed, and
a shell disposed on the quantum well layer, the shell comprising a second semiconductor nanocrystal,
wherein the quantum dot does not comprise cadmium,
wherein the first semiconductor nanocrystal comprises a first zinc chalcogenide,
wherein the second semiconductor nanocrystal comprises a second zinc chalcogenide,
wherein the quantum well layer comprises an alloy semiconductor nanocrystal comprising indium, phosphorus, and gallium,
wherein a bandgap energy of the alloy semiconductor nanocrystal is less than a bandgap energy of the first semiconductor nanocrystal and less than a bandgap energy of the second semiconductor nanocrystal, and
wherein in the quantum dot, a mole ratio of gallium with respect to a sum of indium and gallium is greater than or equal to about 0.01:1 and less than or equal to about 0.5:1.

2. The quantum dot of claim 1, wherein
the first zinc chalcogenide comprises ZnSe, ZnTeSe, ZnSeS, ZnS, or a combination thereof, and
the second zinc chalcogenide independently comprises ZnSe, ZnTeSe, ZnSeS, ZnS, or a combination thereof.

3. The quantum dot of claim 1, wherein the first semiconductor nanocrystal and the second semiconductor nanocrystal have different compositions from one another.

4. The quantum dot of claim 1, wherein
the first semiconductor nanocrystal comprises ZnSe, and
the second semiconductor nanocrystal comprises ZnSe, ZnSeS, ZnS, or a combination thereof.

5. The quantum dot of claim 1, wherein in the quantum dot, a mole ratio of gallium with respect to a sum of indium and gallium is greater than or equal to about 0.05:1 and less than or equal to about 0.3:1.

6. The quantum dot of claim 1, wherein in the quantum dot, a mole ratio of zinc with respect to indium is greater than or equal to about 10:1 and less than or equal to about 30:1.

7. The quantum dot of claim 1, wherein the first semiconductor nanocrystal and the second semiconductor nanocrystal comprise selenium, and in the quantum dot, a mole ratio of selenium respect to a sum of indium and gallium is less than or equal to about 15:1.

8. The quantum dot of claim 1, wherein in the quantum dot, a mole ratio of phosphorus with respect to a sum of indium and gallium is greater than or equal to about 0.5:1 and less than or equal to about 1.3:1.

9. The quantum dot of claim 1, wherein in the quantum dot, a mole ratio of indium and gallium with respect to a sum of chalcogen elements is greater than or equal to about 0.03:1 and less than or equal to about 0.2:1.

10. The quantum dot of claim 1, wherein the shell comprises
a first layer comprising a third zinc chalcogenide, and
a second layer disposed on the first layer and comprising a fourth zinc chalcogenide having a different composition from the third zinc chalcogenide.

11. The quantum dot of claim 10, wherein
the first layer is directly on the quantum well layer, and
the second layer is an outermost layer of the shell.

12. The quantum dot of claim 1, wherein a size of the quantum dot is greater than or equal to about 3 nanometers and less than or equal to about 20 nanometers.

13. The quantum dot of claim 1, wherein the quantum dot comprises an organic ligand on a surface thereof, and the organic ligand comprises RCOOH, RCOOCOR, $RNH_2$, $R_2NH$, $R_3N$, RSH, $R_3PO$, $R_3P$, ROH, RCOOR', $RPO(OH)_2$, $R_2POOH$, or a combination thereof, wherein R and R' are independently a substituted or unsubstituted C1 to C30 aliphatic hydrocarbon, a substituted or unsubstituted C6 to C30 aromatic hydrocarbon, or a combination thereof.

14. The quantum dot of claim 1, wherein an ultraviolet-visible absorption spectrum curve of the quantum dot does not have an inflection point within a wavelength range of about 450 nanometers to about 620 nanometers.

15. The quantum dot of claim 1, wherein the quantum dot exhibits a maximum luminescent peak wavelength in a range of about 500 nanometers to about 545 nanometers.

16. A quantum dot polymer composite comprising
    a polymer matrix; and
    a plurality of quantum dots of claim 1 dispersed in the polymer matrix.

17. The quantum dot-polymer composite of claim 16, wherein the quantum dot polymer composite is in a form of a patterned film.

18. The quantum dot-polymer composite of claim 16, wherein the quantum dot polymer composite exhibits an absorption of greater than or equal to about 90% for blue light.

19. A display device, comprising
    a light emitting element, and optionally a light source,
    wherein the light emitting element comprises the quantum dot-polymer composite of claim 16, and if present, the light source is configured to provide a photoluminescence element with incident light.

20. The display device of claim 19, wherein the light emitting element comprises a stacked structure comprising
    a substrate, and
    a light emitting layer disposed on the substrate,
    wherein the light emitting layer comprises a pattern comprising the quantum dot-polymer composite, and
    wherein the pattern comprises a repeating section emitting light of a predetermined wavelength.

* * * * *